US010991620B2

(12) United States Patent
Lee et al.

(10) Patent No.: US 10,991,620 B2
(45) Date of Patent: Apr. 27, 2021

(54) SEMICONDUCTOR DEVICE

(71) Applicant: SAMSUNG ELECTRONICS CO., LTD., Suwon-si (KR)

(72) Inventors: Sang-Hyun Lee, Hwaseong-si (KR); Sung-Woo Kang, Suwon-si (KR); Keun-Hee Bai, Suwon-si (KR); Hak-Yoon Ahn, Seoul (KR); Seong-Han Oh, Namyangju-si (KR); Young-Mook Oh, Hwaseong-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 20 days.

(21) Appl. No.: 16/282,441

(22) Filed: Feb. 22, 2019

(65) Prior Publication Data

US 2020/0027786 A1 Jan. 23, 2020

(30) Foreign Application Priority Data

Jul. 23, 2018 (KR) ........................ 10-2018-0085259

(51) Int. Cl.
| | |
|---|---|
| *H01L 21/768* | (2006.01) |
| *H01L 27/11* | (2006.01) |
| *H01L 27/088* | (2006.01) |
| *H01L 23/535* | (2006.01) |
| *H01L 29/49* | (2006.01) |

(Continued)

(52) U.S. Cl.
CPC .... *H01L 21/76897* (2013.01); *H01L 21/7682* (2013.01); *H01L 21/76805* (2013.01); *H01L 21/76895* (2013.01); *H01L 21/823431* (2013.01); *H01L 21/823468* (2013.01); *H01L 21/823475* (2013.01); *H01L 23/535* (2013.01); *H01L 27/0886* (2013.01); *H01L 27/1104* (2013.01); *H01L 29/4991* (2013.01); *H01L 29/518* (2013.01)

(58) Field of Classification Search
None
See application file for complete search history.

(56) References Cited

U.S. PATENT DOCUMENTS 9,461,143 B2 10/2016 Pethe et al.
9,722,043 B2 8/2017 Basker et al.
(Continued)

FOREIGN PATENT DOCUMENTS

KR 10-2018-0032359 A 3/2018

*Primary Examiner* — Nicholas J Tobergte
*Assistant Examiner* — Kien C Ly
(74) *Attorney, Agent, or Firm* — Lee IP Law, P.C.

(57) ABSTRACT

A semiconductor device includes gates extending in a first direction on a substrate, each gate of the gates including a gate insulation layer, a gate electrode, and a first spacer, first contact plugs contacting the substrate between adjacent ones of the gates, the first contact plugs being spaced apart from sidewalls of corresponding ones of the gates, a second contact plug contacting an upper surface of a corresponding gate electrode, the second contact plug being between first contact plugs, and an insulation spacer in a gap between the second contact plug and an adjacent first contact plug, the insulation spacer contacting sidewalls of the second contact plug and the adjacent first contact plug, and upper surfaces of the second contact plug and the adjacent first contact plug being substantially coplanar with each other.

20 Claims, 28 Drawing Sheets

(51) Int. Cl.
    *H01L 29/51*      (2006.01)
    *H01L 21/8234*    (2006.01)

(56) References Cited

U.S. PATENT DOCUMENTS

| | | |
|---|---|---|
| 9,799,560 B2 | 10/2017 | Song et al. |
| 9,853,110 B2 | 12/2017 | Zhang et al. |
| 9,905,671 B2 | 2/2018 | Cheng et al. |
| 9,941,278 B2 | 4/2018 | Labonte et al. |
| 10,043,800 B2 | 8/2018 | Kim et al. |
| 2016/0284641 A1* | 9/2016 | Liou ................. H01L 21/28008 |
| 2017/0186849 A1* | 6/2017 | Chen ................... H01L 29/6656 |
| 2017/0278752 A1 | 9/2017 | Ryckaert et al. |
| 2018/0083002 A1 | 3/2018 | Kim et al. |
| 2018/0219010 A1 | 8/2018 | Kim et al. |

\* cited by examiner

SEMICONDUCTOR DEVICE

CROSS-REFERENCE TO RELATED APPLICATION

Korean Patent Application No. 10-2018-0085259, filed on Jul. 23, 2018, in the Korean Intellectual Property Office, and entitled: "A Semiconductor Device," is incorporated by reference herein in its entirety.

BACKGROUND

1. Field

Example embodiments relate to a semiconductor device. More particularly, example embodiments relate to semiconductor devices including a transistor and contact plugs.

2. Description of the Related Art

A semiconductor device may include a transistor. The semiconductor device may further include contact plugs electrically connected with a gate and active regions of the transistor.

SUMMARY

According to example embodiments, there is provided a semiconductor device. The semiconductor may include a plurality of gates, a plurality of first contact plugs, a second contact plug and an insulation spacer. The gates extending in a first direction may be formed on a substrate, and each of the gates may include a gate insulation layer, a gate electrode and a first spacer. The first contact plugs may contact the substrate between the gates, and the first contact plugs may be spaced apart from sidewalls of the gates. The second contact plug may contact an upper surface of the gate electrode between the first contact plugs. The insulation spacer may be disposed in a gap between the first and second contact plugs, and the insulation spacer may contact sidewalls of the first and second contact plugs. Upper surfaces of the first and second contact plug may be substantially coplanar with each other.

According to example embodiments, there is provided a semiconductor device. The semiconductor may include a plurality of gates, a plurality of first contact plugs, an insulation structure, a second contact plug and an insulation spacer. The gates may be formed on a substrate, and may extend in a first direction. Each of gates may include a gate insulation layer, a gate electrode and a first spacer. The first contact plugs may contact the substrate between the gates, and the first contact plugs may be spaced apart from sidewalls of the gates. An upper surface of the first contact plug may be higher than an upper surface of each of the gates. The insulation structure may cover upper surfaces of the gates, and the insulation structure may include a liner pattern and an insulation pattern. The second contact plug formed on the gate, and the second contact plug may contact an upper surface of the gate electrode between the first contact plugs. The insulation spacer may contact sidewalls of the first and second contact plugs, and the insulation spacer may be disposed between the first and second contact plugs. A length in the first direction of the first contact plugs may be greater than a length in the first direction of the second contact plug.

According to example embodiments, there is provided a semiconductor device. The semiconductor may include a plurality of gates, a plurality of first contact plugs, an insulation structure, a second contact plug and an insulation spacer. The gates may be formed on a substrate, and may extend in a first direction. Each of gates may include a gate insulation layer, a gate electrode and a first spacer. The first contact plugs may contact the substrate between the gates, and the first contact plugs may be spaced apart from sidewalls of the gates. The insulation structure may cover upper surfaces of the gates, and the insulation structure may include a liner pattern and an insulation pattern. The second contact plug may be formed through the insulation pattern and liner pattern under the insulation pattern, and the second contact plug may contact an upper surface of the gate electrode between the first contact plugs. The liner pattern may have a U-shape having a recess, and the insulation pattern may fill the recess. A width in a second direction perpendicular to the first direction of the insulation structure may be greater than a width in the second direction of the gate.

BRIEF DESCRIPTION OF THE DRAWINGS

Features will become apparent to those of skill in the art by describing in detail exemplary embodiments with reference to the attached drawings in which.

DETAILED DESCRIPTION

Example embodiments will be more clearly understood from the following detailed description taken in conjunction with the accompanying drawings.

Figure 1:
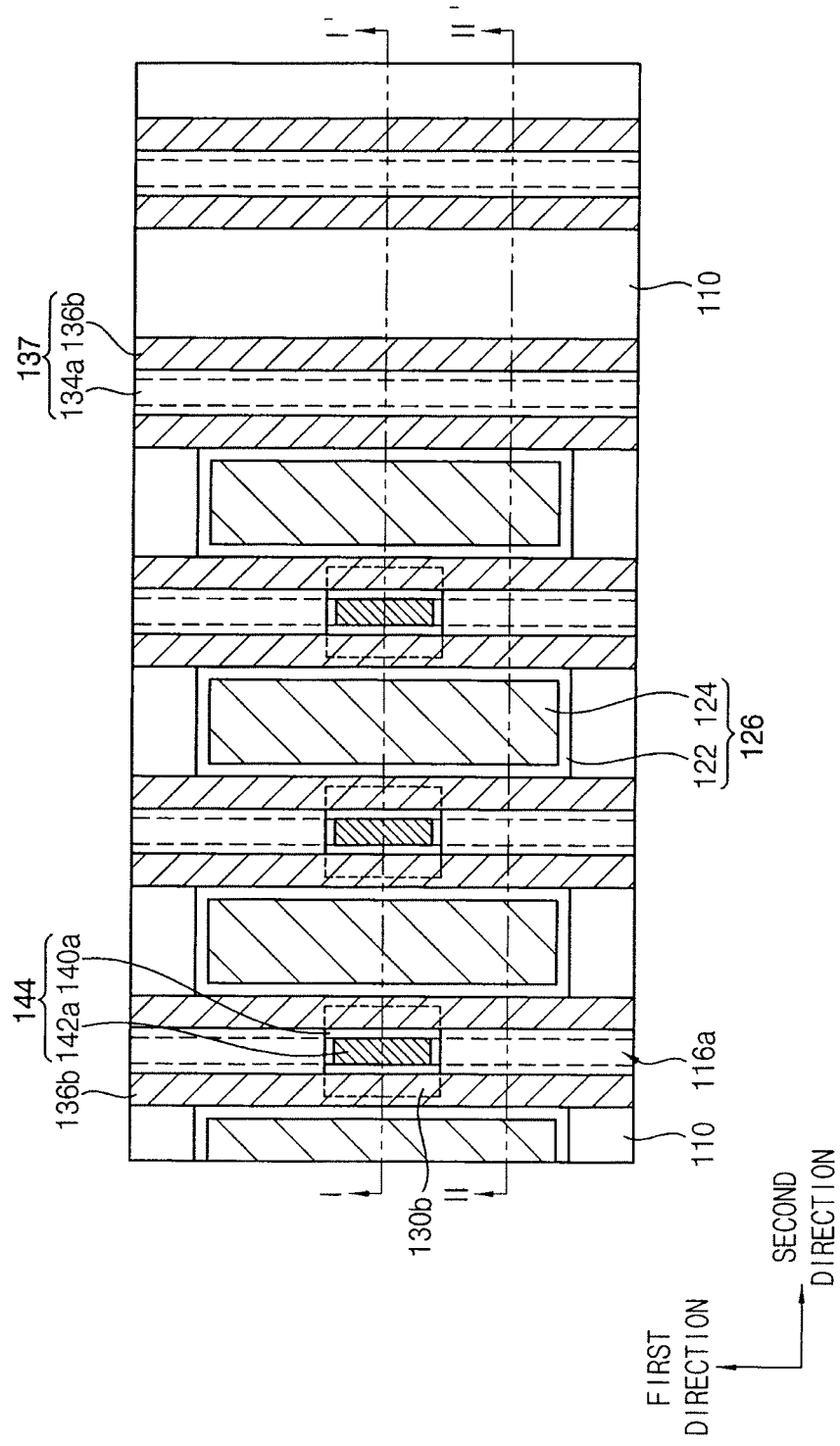
FIG. 1 illustrates a plan view of a semiconductor device in accordance with example embodiments.
Figure 2:
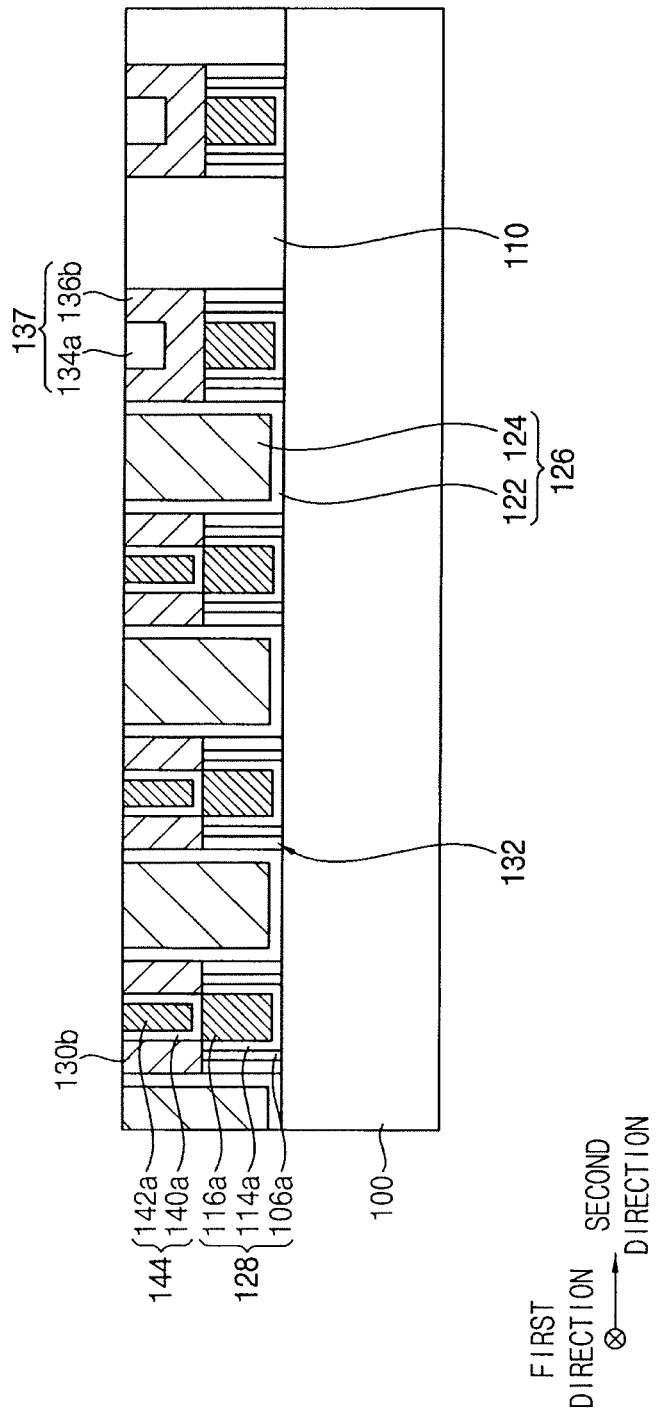
FIGS. 2 and 3 illustrate cross-sectional views along lines I-I' and II-II' of FIG. 1, respectively.
Figure 3:
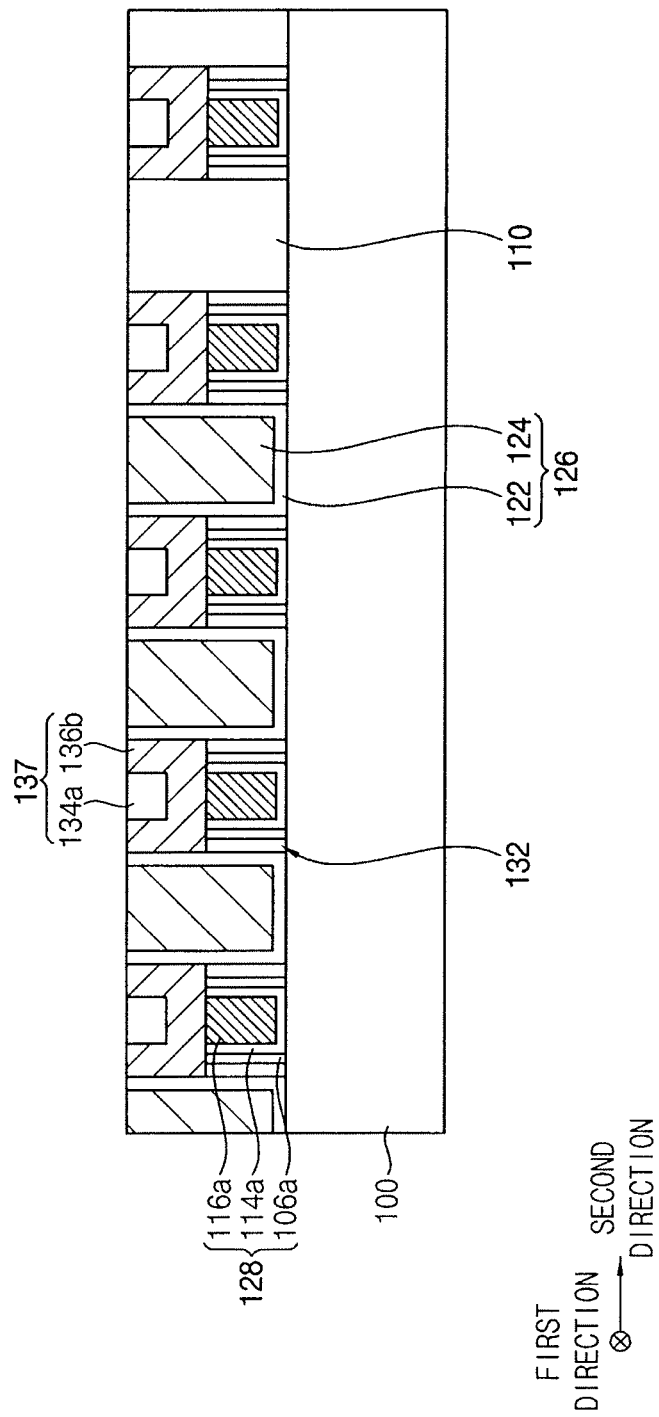
Figure 4:
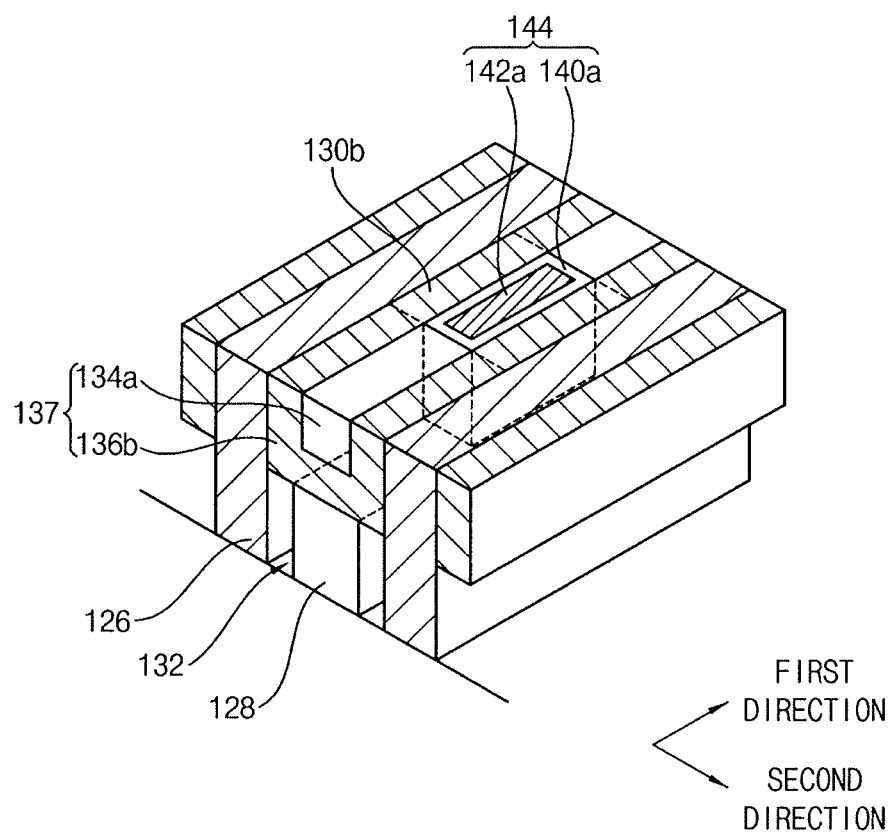
FIG. 4 illustrates a perspective view of a portion of a contact plug in the semiconductor devices in accordance with example embodiments.

FIG. 1 is a plan view illustrating a semiconductor device in accordance with example embodiments. FIGS. 2 and 3 are cross-sectional views illustrating the semiconductor device in accordance with example embodiments, respectively. FIG. 4 is a perspective view illustrating a portion of a contact plug in the semiconductor devices in accordance with example embodiments.

FIG. 2 is a cross-sectional view taken along line I-I' of FIG. 1, and FIG. 3 is a cross-sectional view taken along line II-II' of FIG. 1. In FIG. 4, detail structures of a gate and a first contact plug are omitted. Hereinafter, a direction substantially parallel to an upper surface of a substrate may be defined as a first direction, and a direction substantially parallel to the upper surface of the substrate and substantially perpendicular to the first direction may be defined as a second direction.

Referring to FIGS. 1 to 4, the semiconductor device may be formed on a substrate 100. A plurality of gates 128 extending in the first direction may be formed on the substrate 100. Each of the gates 128 may include a gate insulation layer 114a, a gate electrode 116a, and a first spacer 106a. A first contact plug 126 may be formed at a portion between the gates 128, e.g., between two gates 128 adjacent to each other in a second direction, and the first contact plug 126 may be spaced apart from sidewalls of the, e.g., adjacent, gates 128. A second contact plug 144 may contact an upper surface of the gate electrode 116a between the first contact plugs 126, e.g., the second contact plug 144 may be between two first contact plugs 126 adjacent to each other along the second direction. An insulation spacer 130b may be formed between the first and second contact plugs 126 and 144. A first insulating interlayer 110 may fill a portion between the gates 128 without a first contact plug 126, e.g., the first insulating interlayer 110 may fill a portion between adjacent gates 128 where the first contact plug 126 is not formed, and the first insulating interlayer 110 may be spaced apart from the sidewalls of the gates 128. A liner pattern 136b and an insulation pattern 134a may be formed on the gate 128 where the second contact plug 144 is not formed.

The substrate 100 may include a single crystal silicon. In example embodiments, the substrate 100 may be, e.g., a silicon-on-insulator (SOI) substrate, or a germanium-on-insulator (GOI) substrate.

In example embodiments, the semiconductor device may include a fin-field effect transistor (finFET). In this case, the substrate 100 may include active fins 101a (refer to FIG. 6) extending in the second direction and an isolation layer between the active fins 101a. Each of the active fins 101a may protrude from an upper surface of the isolation layer. An epitaxial structure 101b (refer to FIG. 6) may be formed between the active fins 101a in the first direction, so that the active fins 101a may be connected to each other by the epitaxial structure 101b. The epitaxial structure 101b and the active fins 101a connecting the epitaxial structure 101b may include impurity regions serving as source/drain regions of the fin-FET.

In some example embodiments, the semiconductor device may include a planar type transistor. In this case, an isolation layer may be formed in a trench of the substrate 100.

The gates 128 may be spaced apart from each other in the second direction.

The gate insulation layer 114a may include, e.g., silicon oxide or metal oxide. The metal oxide may include, e.g., hafnium oxide ($HfO_2$), tantalum oxide ($Ta_2O_5$), zirconium oxide ($ZrO_2$), etc. The gate insulation layer 114a may surround a sidewall and a bottom of the gate electrode 116a.

The gate electrode 116a may include, e.g., a metal such as aluminum, copper, tantalum, tungsten, cobalt, etc., or a metal nitride thereof.

The first spacer 106a may be formed on sidewalls of the gate insulation layer 114a and the gate electrode 116a stacked. In example embodiments, the first spacer 106a may include a low-k material having a dielectric constant lower than a dielectric constant of the silicon oxide ($SiO_2$). For example, the first spacer 106a may include, e.g., silicon oxide including carbon and hydrogen (SiCOH), fluorine doped silicon oxide ($F—SiO_2$), porous silicon oxide, etc. In some example embodiments, the first spacer 106a may include silicon oxide.

The first contact plugs 126 may extend in the first direction. The first contact plugs 126 may contact portions of the substrate 100 corresponding to the source/drain regions of the transistor. Upper surfaces of the first contact plugs 126 may be higher than an upper surface of each of the gates 128.

Each of the first contact plugs 126 may include a first barrier pattern 122 and a first metal pattern 124. The first barrier pattern 122 may surround a sidewall and a bottom of the first metal pattern 124. The first barrier pattern 122 may include, e.g., titanium, titanium nitride, tantalum, tantalum nitride, etc. The first metal pattern 124 may include, e.g., cobalt, aluminum, copper, tungsten, nickel, platinum, gold, silver, etc.

The first insulating interlayer 110 may include, e.g., silicon oxide. An upper surface of the first insulating interlayer 110 may be substantially coplanar with the upper surface of the first contact plug 126. Thus, the upper surface of the first insulating interlayer 110 may be higher than an upper surface of the gate 128. A sidewall in the first direction of the first contact plug 126 may contact the first insulating interlayer 110.

The second contact plug 144 may be disposed between the first contact plugs 126 in the second direction. Thus, the first contact plug 126, the second contact plug 144, and the first contact plug 126 may be sequentially arranged in parallel in the second direction, i.e., the first and second contact plugs 126 and 144 may be arranged alternately in the second direction.

In example embodiments, a length in the first direction of the second contact plug 144 may be less than a length in the first direction of the first contact plug 126. As the second contact plug 144 is disposed between the first contact plugs 126 extending in the first direction, an additional horizontal area of the substrate 100 for forming the second contact plug 144 may not be needed. Thus, the horizontal area of the substrate for manufacturing the semiconductor device may decrease.

An upper surface of the second contact plug 144 may be substantially coplanar with the upper surface of the first contact plug 126. Thus, the upper surface of the second contact plug 144 may be higher than an upper surface of the gate 128.

The second contact plug 144 may include a second barrier pattern 140a and a second metal pattern 142a. The second barrier pattern 140a may surround a sidewall and a bottom of the second metal pattern 142a. The second barrier pattern 140a may include, e.g., titanium, titanium nitride, tantalum, tantalum nitride, etc. The second metal pattern 142a may include, e.g., cobalt, aluminum, copper, tungsten, nickel, platinum, gold, silver, etc.

The insulation spacer 130b may be formed between the second contact plug 144 and the first contact plugs 126 adjacent to the second contact plug 144 in the second direction. Thus, in a cross-sectional view, the insulation spacer 130b may be formed on a sidewall in the first direction of the second contact plug 144. In example embodiments, the insulation spacer 130b may contact an upper sidewall of the first contact plug 126 and the sidewall of the second contact plug 144, respectively. The insulation spacer 130b may be formed on the gate 128, and may extend in the first direction. In example embodiments, a width in the second direction of the insulation spacer 130b may be greater than a width in the second direction of a gap between the first contact plug 126 and the gate 128.

In example embodiments, an air space filled with air may be formed between the first contact plug 126 and the gate 128, below a bottom of the insulation spacer 130b. That is, an air tunnel 132 extending in the first direction may be formed below a bottom of the insulation spacer 130b. Thus, a parasitic capacitance between the first contact plug 126 and the gate 128 may decrease.

An insulation structure 137 including the liner pattern 136b and the insulation pattern 134a may be formed on the gate 128 where the second contact plug 144 is not formed. An upper surface of the insulation structure 137 may be substantially coplanar with the upper surface of the first contact plug 126.

The liner pattern 136b may have a U-shape, so that the liner pattern 136b on the gate 128 may not be separated from each other. That is, as illustrated in FIGS. 2-3, the liner pattern 136b may have two vertical portions connected at the bottom by a horizontal portion, so a recess may be defined above the horizontal portion between the two vertical portions, i.e., to define the U-shape.

The liner pattern 136b may extend in the first direction. The liner pattern 136b may include a material substantially the same as a material of the insulation spacer 130b. Thus, the liner pattern 136b and the insulation spacer 130b may be merged with, e.g., into, a single body. That is, in a portion for forming the second contact plug 144, the insulation spacer 130b may be formed to have a shape in which a bottom portion of the liner pattern 136b is removed, i.e., only the two vertical portions remain without the horizontal portion therebetween.

The liner pattern 136b and insulation spacer 130b may have an insulation material having a high etching selectivity with respect to silicon oxide. In example embodiments, the liner pattern 136b and the insulation spacer 130b may include, e.g., silicon nitride.

The insulation pattern 134a may fill the recess of the liner pattern 136b. The insulation structure 137 including the liner pattern 136b and the insulation pattern 134a may have a flat upper surface, and the upper surface of the insulation structure 137 may be substantially coplanar with the upper surface of the first contact plug 126. The insulation pattern 134a may include, e.g., silicon oxide.

The insulation structure 137 may cover the upper surface of a portion of the gate 128 where the second contact plug 144 is not formed. A width in the second direction of the insulation structure 137 may be greater than a width in the second direction of the gate 128.

In example embodiments, the insulation structure 137 between the gates 128 may contact the sidewall in the first direction of the second contact plug 144. The liner pattern 136b may contact the upper sidewall of the first contact plug 126 and the upper surface of the gate 128.

In example embodiments, the liner pattern 136b may contact the upper sidewall of the first contact plug 126, the upper surface of the gate 128 and an upper sidewall of the first insulating interlayer 110. Alternatively, the liner pattern 136b may contact the upper surface of the gate 128 and the upper sidewall of the first insulating interlayer 110.

In example embodiments, an air space filled with air may be formed between the first contact plug 126 and the gate 128, and between the gate 128 and the first insulating interlayer 110, below a bottom of the insulation structure 137.

As described above, the air tunnel 132 extending in the first direction may be formed along the sidewall of the gate 128. Thus, a parasitic capacitance between the first contact plug 126 and the gate 128 may decrease.

FIGS. 5 to 22 are cross-sectional views, plan views, and perspective views illustrating stages in a method of manufacturing a semiconductor device in accordance with example embodiments. FIGS. 6, 10, 12, 14, 17 and 21 are plan views. FIGS. 5, 7, 8, 9, 11, 13, 16, 18, 20 and 22 are cross-sectional views taken along lines I-I' of corresponding plan views. FIGS. 15 and 19 are perspective views of portions of a first contact plug and a second contact plug.

Figure 5:
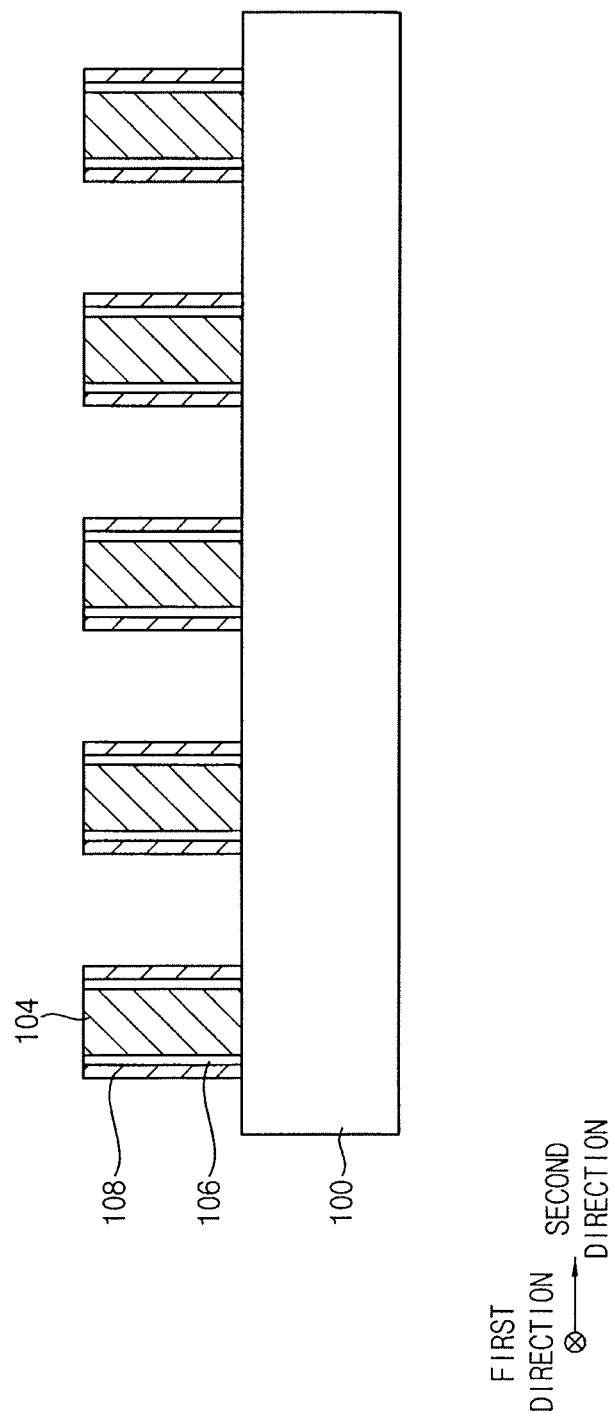
FIGS. 5 to 22 illustrate cross-sectional views, plan views, and perspective views of stages in a method of manufacturing a semiconductor device in accordance with example embodiments.
Figure 6:
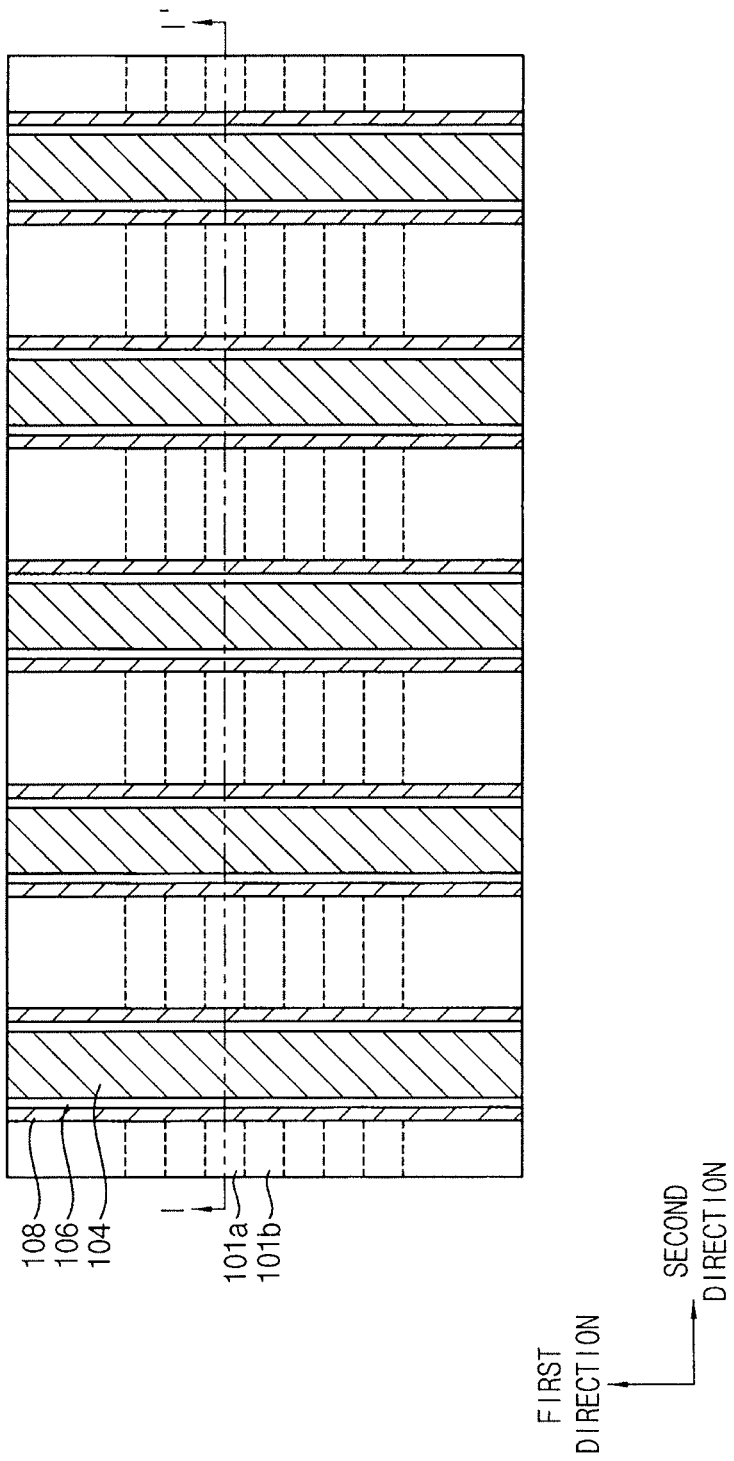

Referring to FIGS. 5 and 6, a plurality of dummy gate patterns 104 may be formed on the substrate 100. A preliminary first spacer 106 and a second spacer 108 may be sequentially formed on a sidewall of each of the dummy gate patterns 104.

In example embodiments, a transistor in the semiconductor device may include a fin-FET. In this case, active fins 101a and an isolation layer may be formed at the substrate 100. Also, an epitaxial structure 101b may be formed between the active fin 101a being exposed by the dummy gate patterns 104.

Particularly, upper portions of the substrate 100 may be etched to form trenches. An isolation layer may fill a lower portion of each of the trenches. Portions of the substrate 100 where an upper surface is not covered by the isolation layer may serve as active fins. Each of the active fins 101a may extend in the second direction, and the active fins 101a may be arranged, e.g., spaced apart from each other, in the first direction. The active fins 101a between the dummy gate patterns 104 may be partially etched to form a recess. A selective epitaxial growth (SEG) process using a surface of the recess as a seed may be performed to form the epitaxial structure 101b. The epitaxial structure 101b and the active fins 101a may be merged with a structure extending in the first direction. In example embodiments, in the SEG process, the epitaxial structure 101b may be doped with impurities in-situ.

In some example embodiments, a transistor in the semiconductor device may include a planar type transistor. In this case, upper portions of the substrate 100 may be etched to form trenches. An isolation layer may fill the trenches. Thus, the isolation layer may serve as a field region.

In example embodiments, the dummy gate pattern 104 may be formed by forming a polysilicon layer and patterning the polysilicon layer. The dummy gate pattern 104 may extend in the first direction. Also, a plurality of dummy gate patterns 104 may be spaced apart from each other, and the dummy gate patterns 104 may have a regular interval in the second direction.

The preliminary first spacer 106 may directly contact sidewalls the dummy gate patterns 104. In example embodiments, the preliminary first spacer 106 may include a material having a dielectric constant lower than a dielectric constant of silicon oxide. In some example embodiments, the preliminary first spacer 106 may include the silicon oxide.

The second spacer 108 may contact the preliminary first spacer 106. The second spacer 108 may include a material having a high etching selectivity with respect to the silicon oxide. The second spacer 108 may include silicon nitride.

Figure 7:
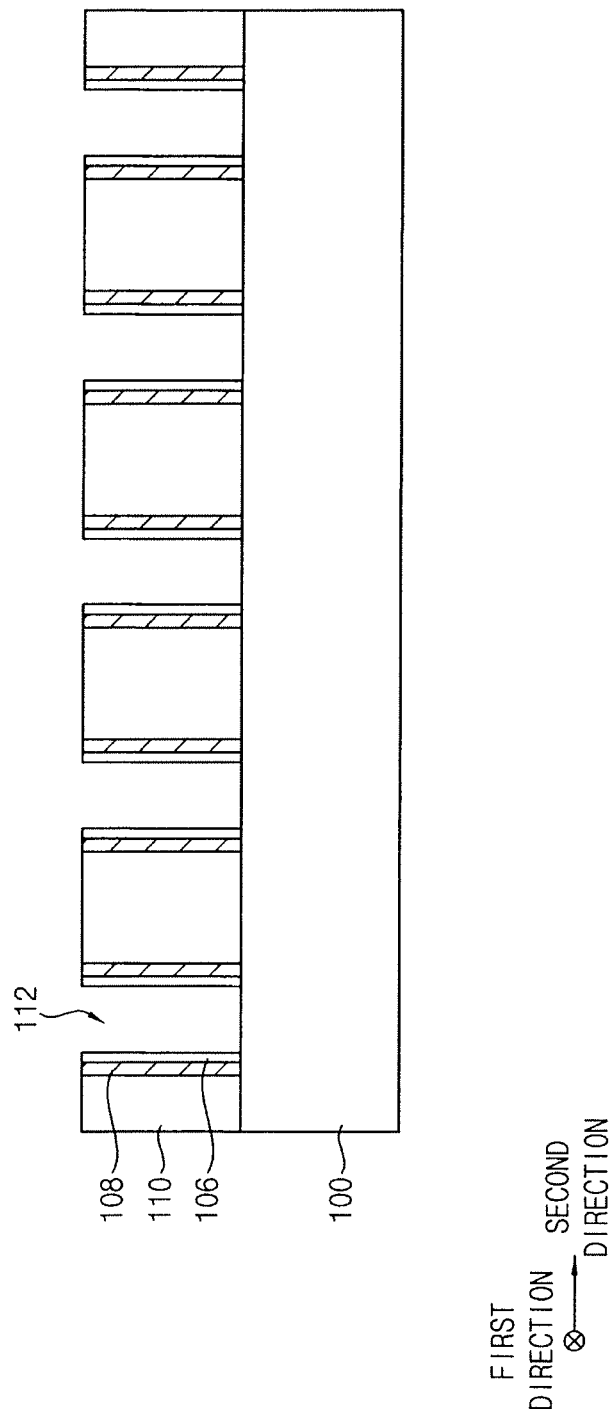

Referring to FIG. 7, the first insulating interlayer 110 may be formed on the dummy gate patterns to fill a gap between the dummy gate patterns 104. The first insulating interlayer 110 may be planarized until upper surfaces of the dummy gate patterns 104 are exposed. The planarization process may be performed by a chemical mechanical polishing (CMP) process and/or an etch back process.

The dummy gate pattern 104 may be removed to form a first opening 112. The first opening 112 may extend in the first direction. The preliminary first spacer 106 may be exposed by a sidewall of the first opening 112. Also, the substrate 100 may be exposed by a bottom of the first opening 112.

Figure 8:
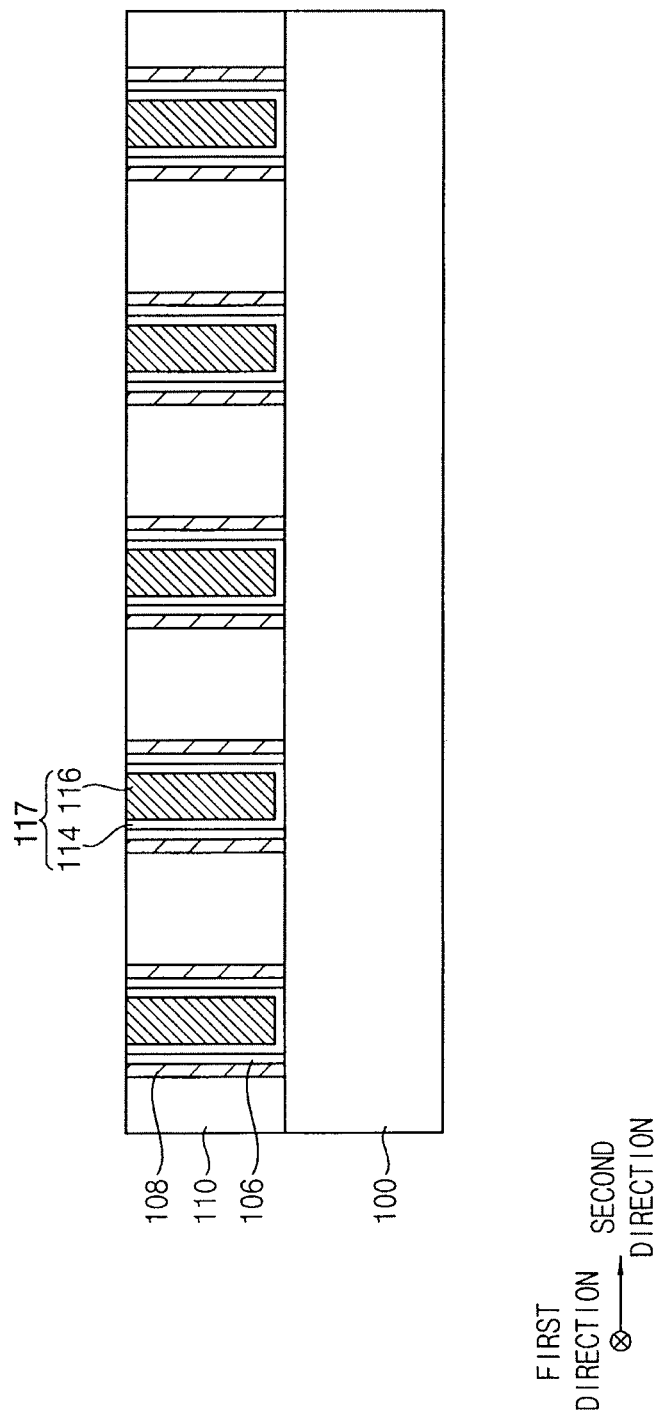

Referring to FIG. 8, a preliminary gate structure 117 including a high dielectric layer 114 and a preliminary gate electrode 116 may be formed in the first opening 112. In example embodiments, a thermal oxide layer may be further formed on the substrate 100 exposed by the bottom of the first opening 112.

In example embodiments, a preliminary high dielectric layer may be formed on the sidewall and the bottom of the first opening 112 and the upper surface of the first insulating interlayer 110. A gate electrode layer may be formed on the preliminary high dielectric layer to fill the first opening 112. The gate electrode layer and the preliminary high dielectric layer may be planarized until the upper surface of the first insulating interlayer 110 are exposed to form the high dielectric layer 114 and the preliminary gate electrode 116.

The high dielectric layer 114 may include a metal oxide having a high dielectric constant, e.g., hafnium oxide, tantalum oxide, zirconium oxide, etc. The preliminary gate electrode 116 may include a metal, e.g., tungsten, cobalt, etc. In example embodiments, a work function control layer may be further formed between the high dielectric layer 114 and the preliminary gate electrode 116. The work function control layer may include, e.g., titanium nitride (TiN), titanium aluminum (TiAl), titanium aluminum nitride (TiAlN), tantalum nitride (TaN), tantalum aluminum nitride (TaAlN), etc.

Figure 9:
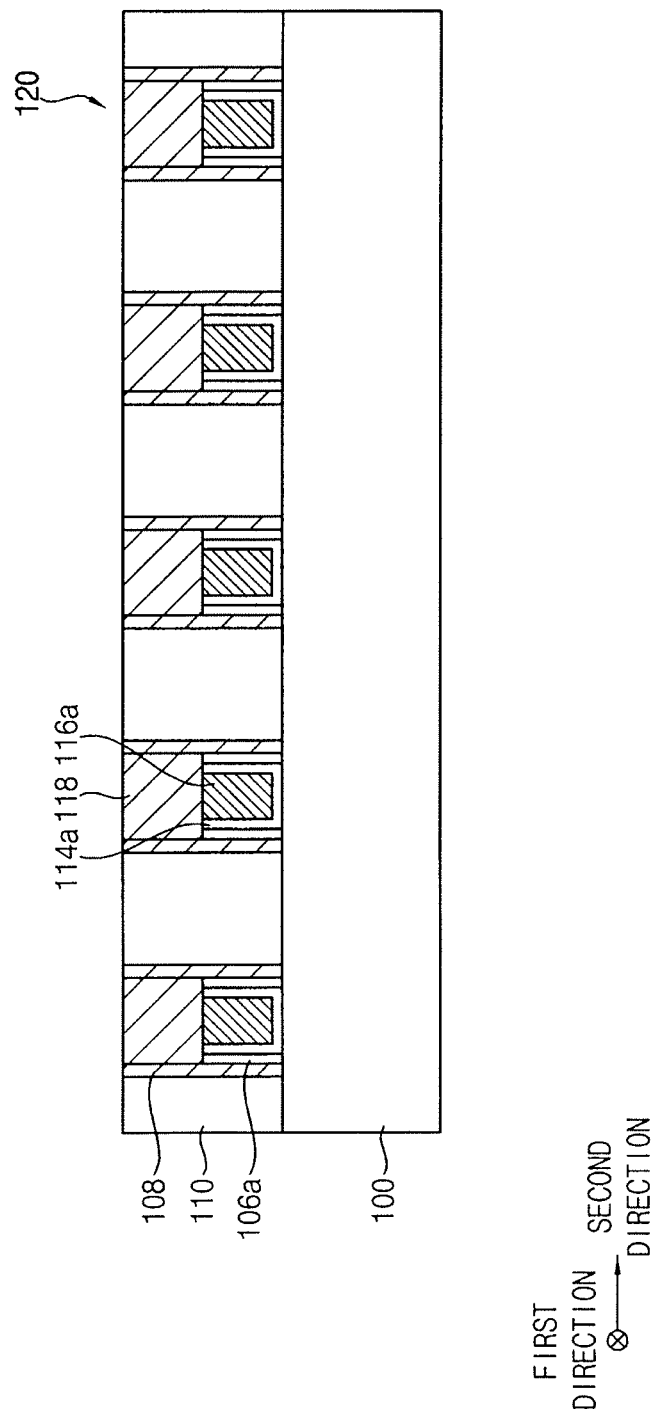
Figure 10:
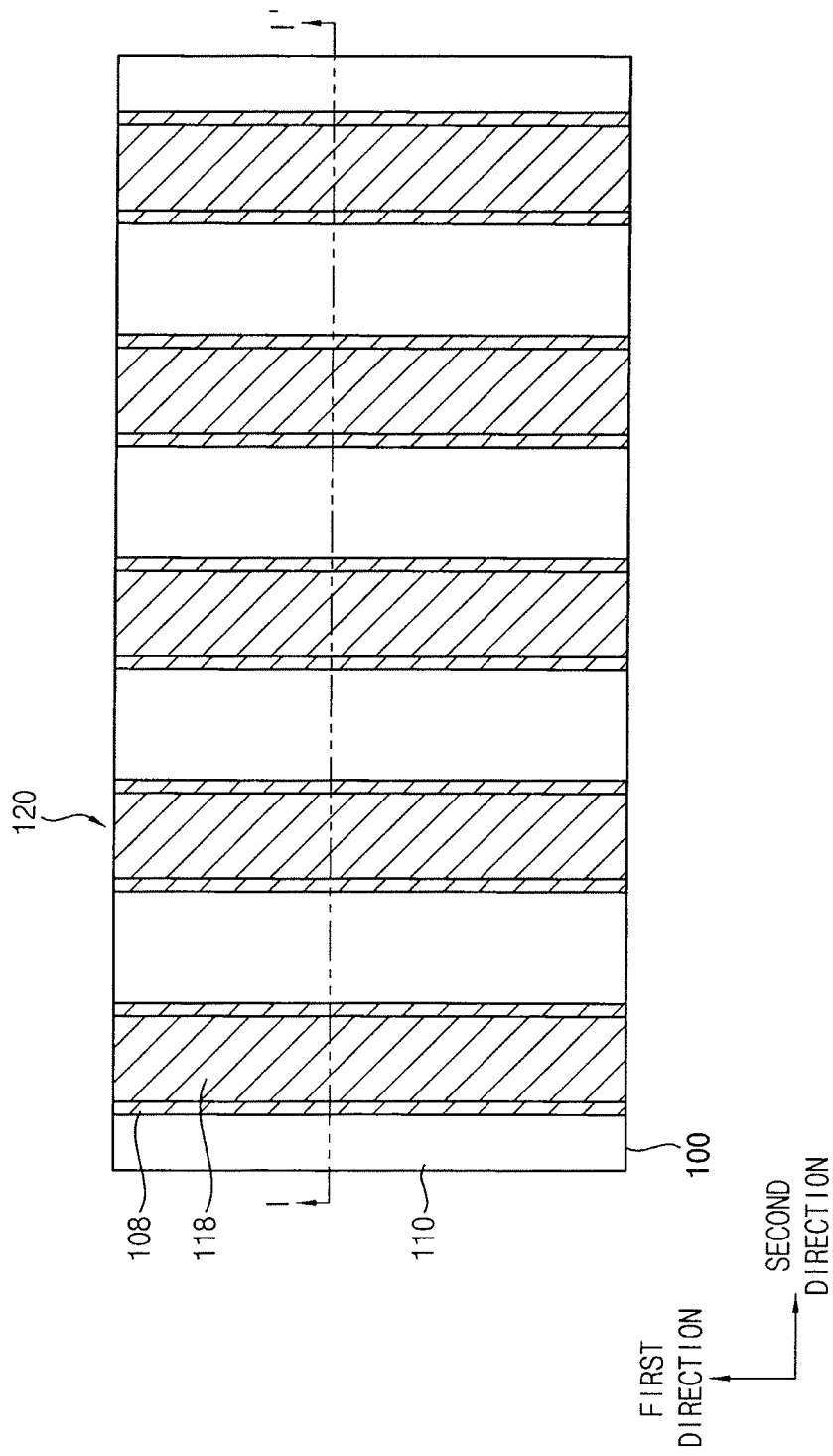

Referring to FIGS. 9 and 10, an upper portion of the preliminary gate electrode 116 may be partially etched to form the gate electrode 116a. During the etching process, upper portions of the high dielectric layer 114 and the preliminary first spacer 106 may be etched together to form the gate insulation layer 114a and the first spacer 106a. Thus, the gate insulation layer 114a may be formed on an inner surface of the first opening 112, and the gate electrode 116a may be formed on the gate insulation layer 114a to partially fill the first opening 112.

A capping layer may be formed on the gate electrode 116a to fill a remaining portion of the first opening 112. An upper surface of the capping layer may be planarized until the upper surface of the first insulating interlayer 110 to form a capping pattern 118. The capping pattern 118 may include, e.g., silicon nitride.

Thus, the gate insulation layer 14a, the gate electrode 116a, the capping pattern 118, the first spacer 106a, and the second spacer 108 may form a preliminary gate structure 120. The first spacer 106a may be formed on the gate insulation layer 114a below the capping pattern 118. The second spacer 108 may be formed on the first spacer 106a and a sidewall of the capping pattern 118.

The first insulating interlayer 110 may be formed between the preliminary gate structures 120. Upper surfaces of the preliminary gate structures 120 and the first insulating interlayer 110 may be substantially coplanar with each other. A silicon nitride of a surface of the preliminary gate structure 120 may be exposed.

Figure 11:
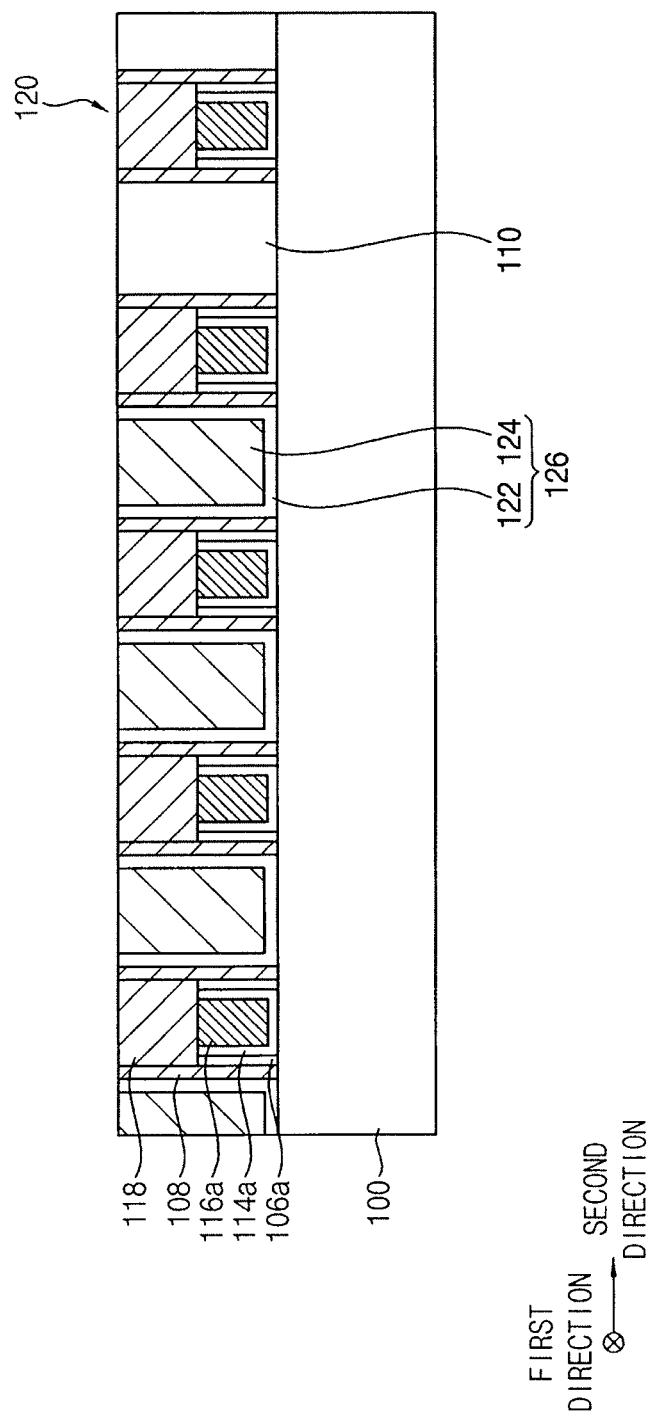
Figure 12:
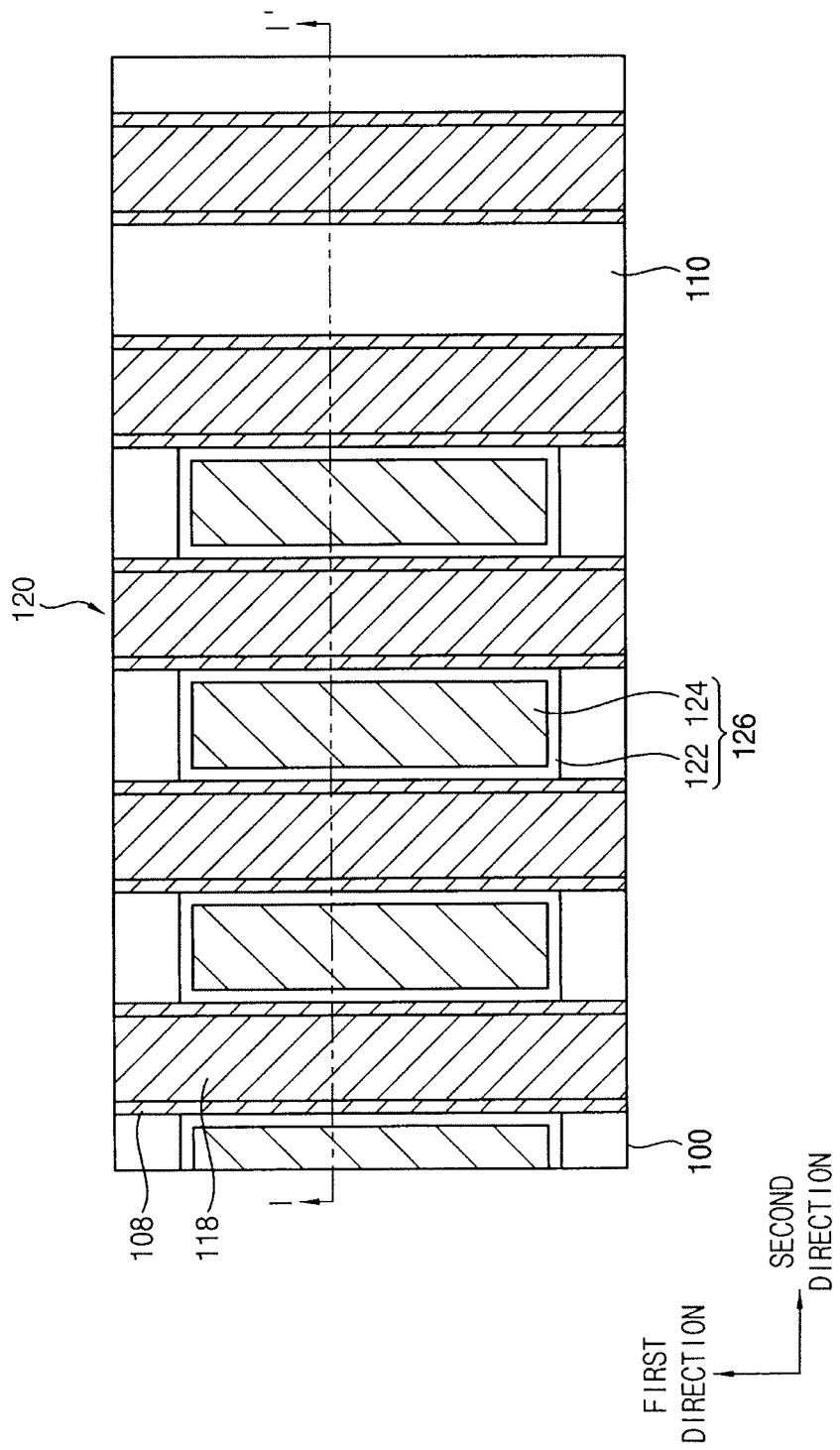

Referring to FIGS. 11 and 12, the plurality of first contact plugs 126 may be formed through the first insulating interlayer 110 between the preliminary gate structures 126. Each of the first contact plugs 126 may contact the surface of the substrate 100. The first contact plugs 126 may extend in the first direction.

Particularly, a first etching mask may be formed on the first insulating interlayer 110. The first insulating interlayer 110 may be etched using the first etching mask to form first contact holes. In example embodiments, the second spacer 108 may be exposed by sidewalls of the first contact holes. The substrate 100 corresponding to source/drain regions of the transistor may be exposed by bottoms of the first contact holes. The first etching mask may be removed.

A first barrier layer may be formed on surfaces of the first contact holes and the upper surface of the preliminary gate structure 120. A first metal layer may be formed on the first barrier layer to fill the first contact holes. The first barrier layer may include, e.g., titanium, titanium nitride, tantalum, tantalum nitride, etc. The first metal layer may include, e.g., cobalt, aluminum, copper, tungsten, nickel, platinum, gold, silver, etc.

The first barrier layer and the first metal layer may be planarized until the upper surface of the first insulating interlayer 110 is exposed. The planarization process may be performed by, e.g., a CMP process and/or an etch back process. Thus, the first contact plug 126 including the first barrier pattern 122 and the first metal pattern 124 may be formed on the substrate 100. A sidewall in the first direction of the first contact plug 126 may contact the first insulating interlayer 110, and a sidewall in the second direction of the first contact plug may contact the second spacer 108.

Figure 13:
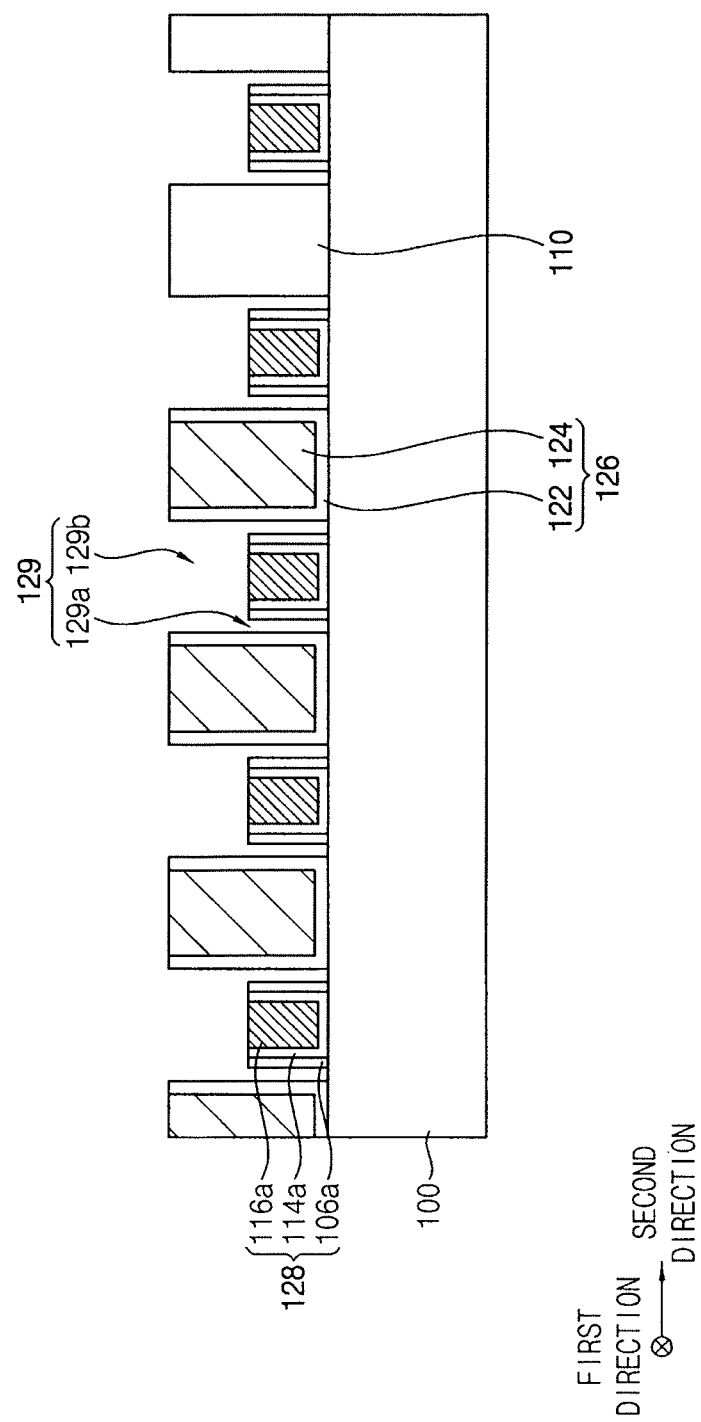
Figure 14:
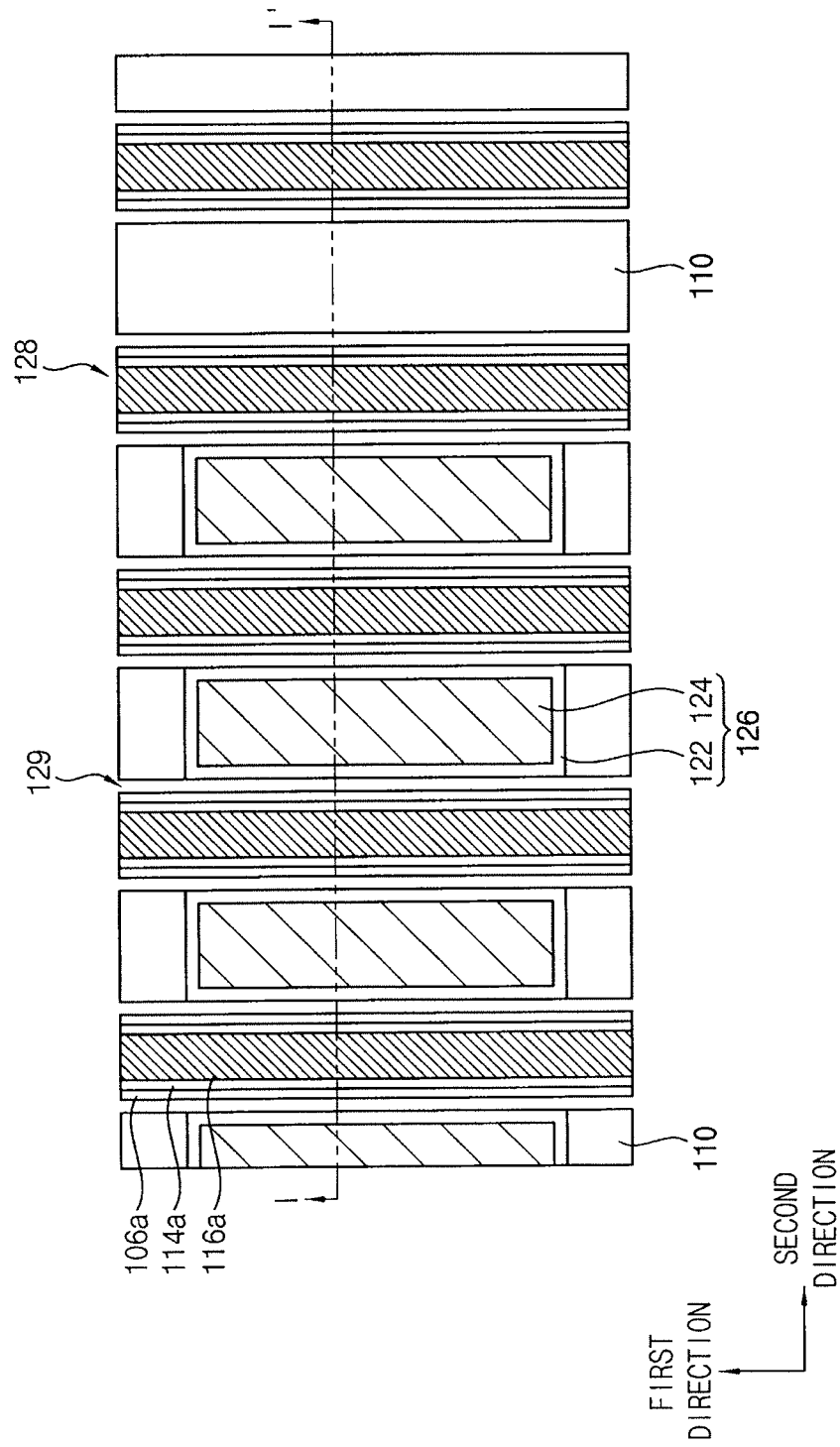
Figure 15:
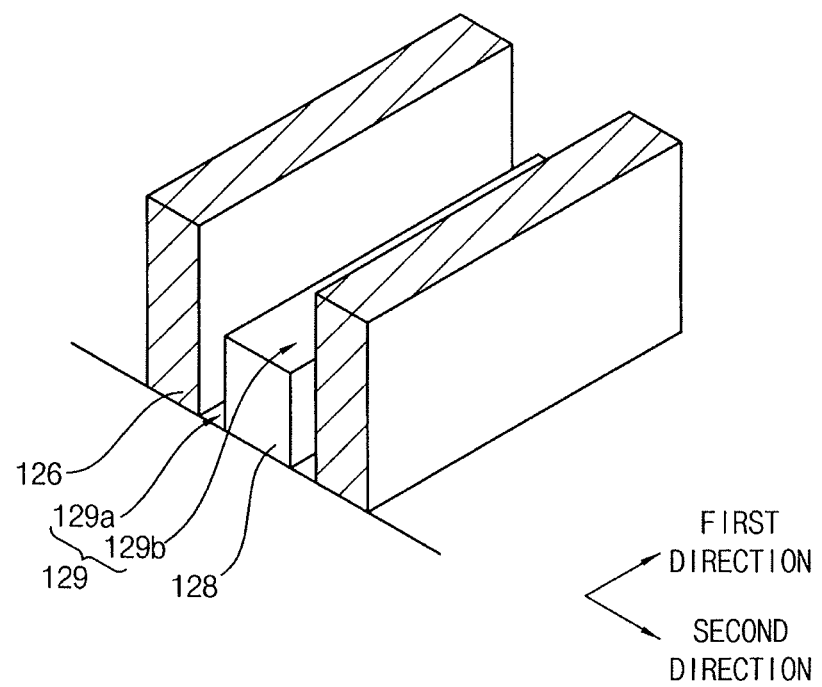

Referring to FIGS. 13, 14, and 15, the capping pattern 118 and the second spacer 108 may be removed to form a second opening 129. In example embodiments, the silicon nitride may be etched by an etch back process, so that the capping pattern 118 and the second spacer 108 may be removed together. In the etching process, the first insulating interlayer 110 may not be etched.

The gate 128 including the gate insulation layer 114a, the gate electrode 116a, and the first spacer 106a may be formed by removing the capping pattern 118 and the second spacer 108. An upper surface of the gate 128 may be lower than the upper surface of the first contact plug 126.

The second opening 129 may include a first gap 129a and a second gap 129b. The first gap 129a may correspond to a removing portion of the second spacer 108 on the sidewall of the gate 128, e.g., a gap remaining between the first barrier pattern 122 and the gate 128 after the second spacer 108 is removed. The second gap 129b may correspond to removing portions of the capping pattern 118 and the second spacer 108 on the sidewall of the capping pattern 118, e.g., a gap remaining above the gate 128 after the capping pattern 118 and the second spacer 108 are removed.

The first gap 129a may be formed between the first contact plug 126 and the gate 128, and between the first insulating interlayer 110 and the gate 128. The second gap 129b may be formed between the first contact plugs 126 over the gate 128, between the first contact plug 126 and the first insulating interlayer 110, and between the first insulating interlayers 110. Surfaces of the gate 128 and the first contact plug 126 may be exposed by the second opening 129.

Figure 16:
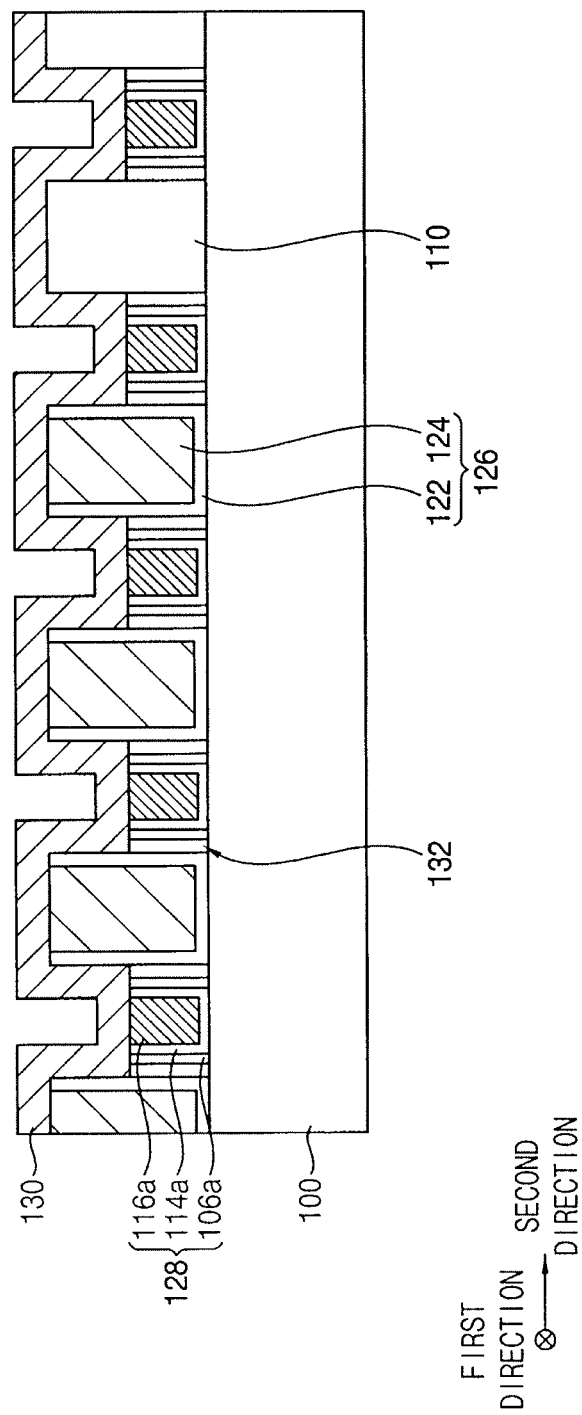
Figure 17:
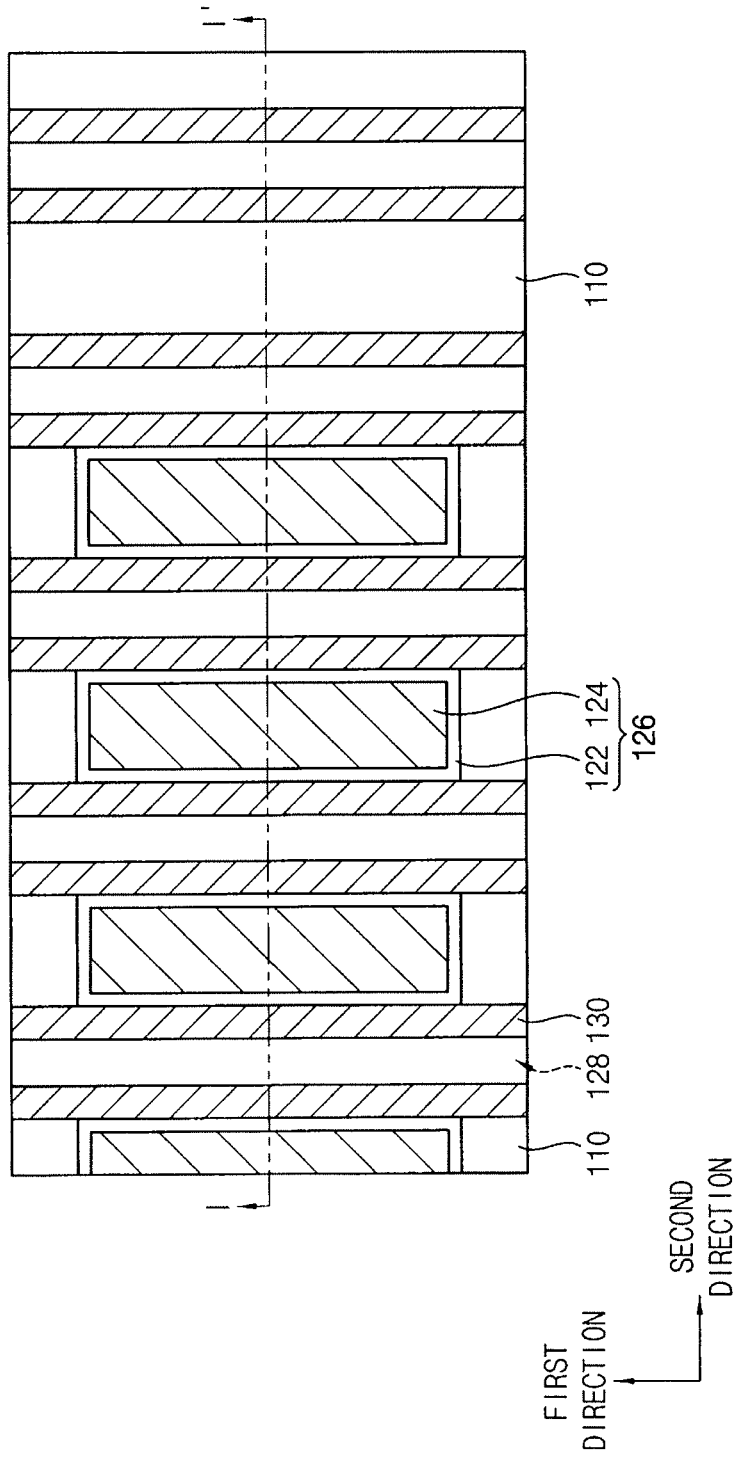

Referring to FIGS. 16 and 17, the insulation liner 130 may be formed on an upper surface of the gate 128, an upper sidewall and an upper surface of the first contact plug 126, and the upper surface of the first insulating interlayer 110. The insulation liner 130 may include an insulation material having a high etching selectivity with respect to silicon oxide, e.g., silicon nitride.

A thickness of the insulation liner 130 on the upper sidewall of the first contact plug 126 may be greater than a width in the second direction of the first gap 129a. Also, the thickness of the insulation liner 130 on the upper sidewall of the first contact plug 126 may be less than half of a width in the second direction of the second gap 129b. Thus, an upper surface of the insulation liner 130 may include a recess at a portion facing, e.g., overlapping, the upper surface of the gate 128.

In example embodiments, the insulation liner 130 may not fill the first gap 129a, e.g., due to the small width of the first gap 129a. In this case, the first gap 129a may serve as the air tunnel 132 extending in the first direction. The air tunnel 132 may be formed between the first contact plug 126 and the gate 128, and between the first contact plug 126 and the first insulating interlayer 110. As the air tunnel 132 is formed, a parasitic capacitance between the first contact plug 126 and the gate 128 may decrease.

Figure 18:
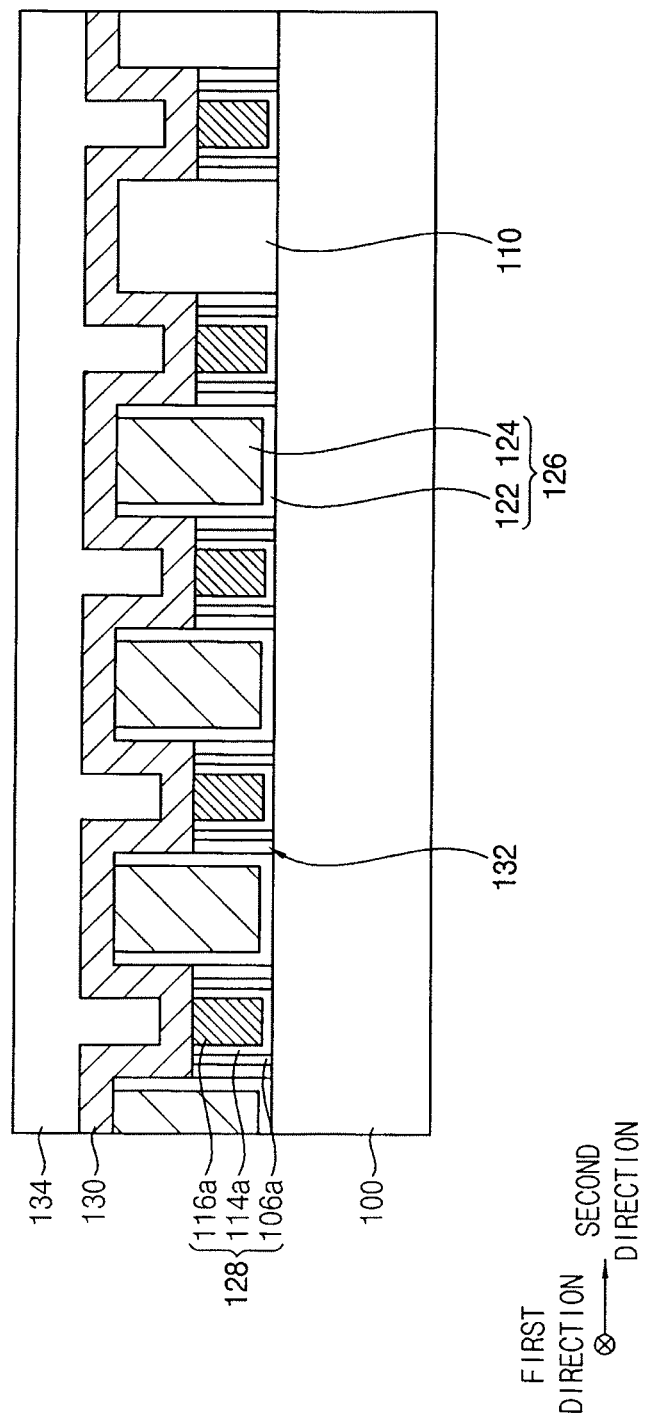
Figure 19:
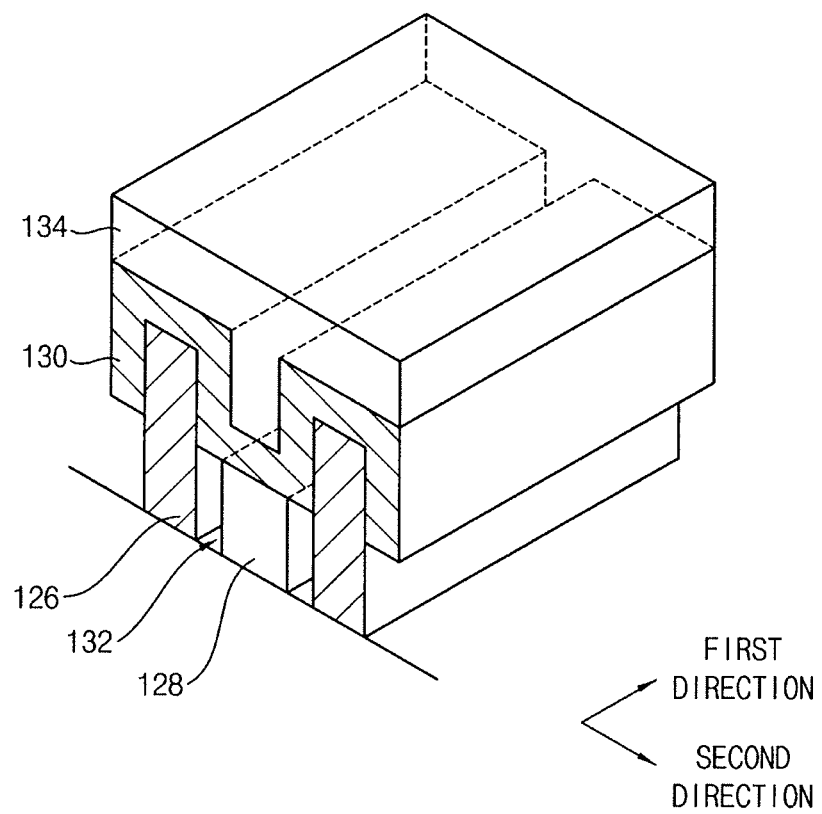

Referring to FIGS. 18 and 19, the insulation layer 134 may be formed on the insulation liner 130 to fill the recess of the insulation liner 130. The insulation layer 134 may be planarized so that an upper surface of the insulation layer 134 is flat. The insulation layer 134 may include, e.g., silicon oxide. After the planarization process, the insulation liner 130 may not be exposed by the insulation layer 134.

Figure 20:
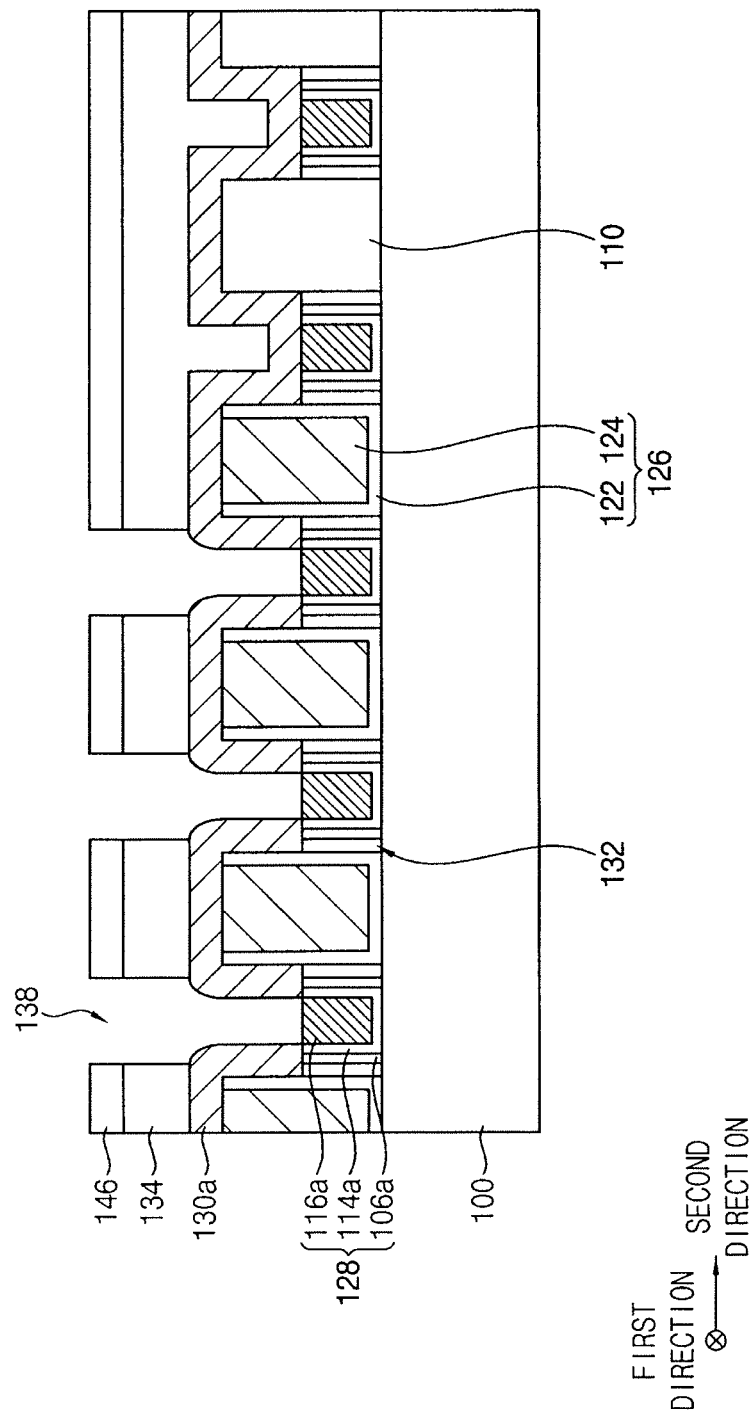
Figure 21:
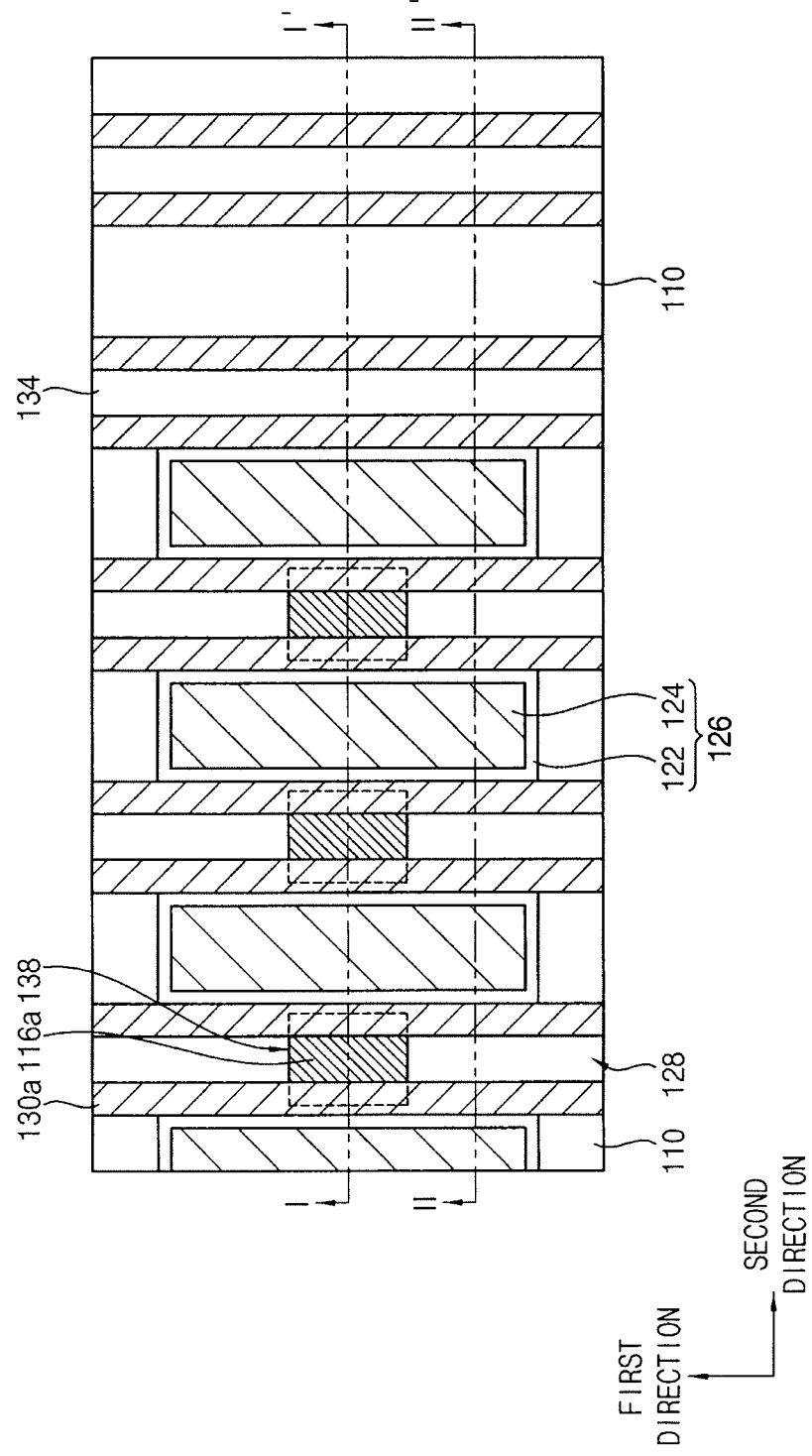

Referring to FIGS. 20 and 21, an etching mask 146 may be formed on the insulation layer 134. The etching mask 146 may serve as a mask for forming a second contact hole exposing the upper surface of the gate electrode 116a. An exposed portion, e.g., opening, of the etching mask 146 may face, e.g., overlap, the recess of the insulation liner 130 between the first contact plugs 126.

The insulation layer 134 may be etched using the etching mask 146 to form a preliminary second contact hole. As the insulation liner 130 has a high etching selectivity with respect to the insulation layer 134, the insulation liner 130 may not be etched during the etching process of the insulation layer 134. Thus, the insulation layer 134 may be etched by self-alignment with the insulation liner 130. Then, the insulation liner 130 exposed by a bottom of the preliminary second contact hole may be etched to form the second contact hole 138 exposing the upper surface of the gate electrode 116a. Also, the insulation liner 130 may be selectively etched to form a preliminary liner pattern 130a.

The exposed portion, i.e., the opening, of the etching mask 146 may be formed to have a width in the second direction that greater than a width of the recess in the insulation liner 130 in the second direction. For example, as seen in FIGS. 20-21, the distance along the second direction between facing sidewalls of the etching mask 146 over the second contact hole 138 is larger than a distance between facing sidewalls of the vertical portions of the insulation liner 130 in the second contact hole 138. Thus, the etching mask 146 may be easily formed. An upper width of the second contact hole 138 over a top surface of the insulation liner 130, i.e., between portions of the insulation layer 134, may be greater than a lower width of the second contact hole 138 corresponding to the recess in the insulation liner 130, i.e., between the vertical portions of the insulation liner 130.

The second contact hole 138 may be self-aligned with the insulation liner 130, so that the first contact plug 126 may not be exposed by a sidewall of the second contact hole 138. Thus, a second contact plug subsequently formed in the second contact hole 138 may contact the upper surface of the gate electrode 116a, and a short failure between the second contact plug and the first contact plug 126 may not occur.

Figure 22:
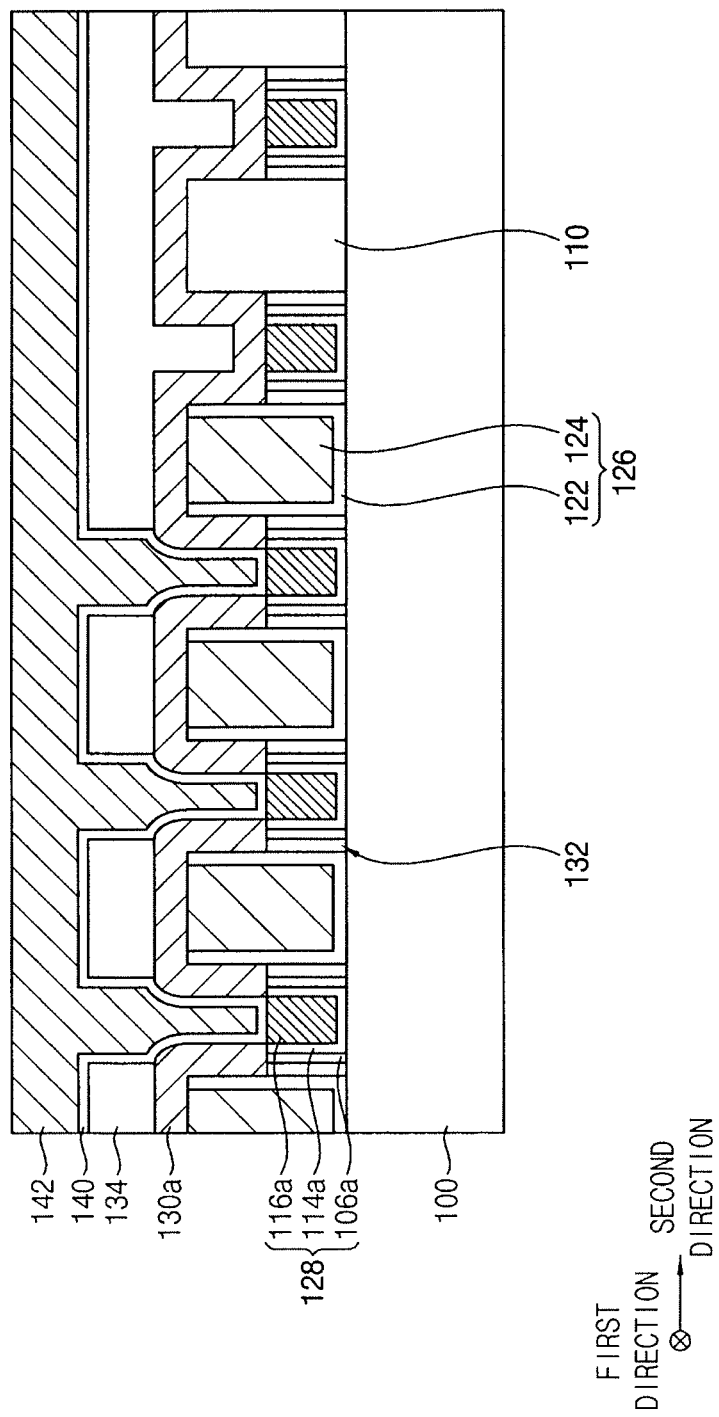

Referring to FIG. 22, a second barrier layer 140 may be formed, e.g., conformally, on an upper surface of the insulation layer 134, the sidewall of the second contact hole 138, and the upper surface of the gate electrode 116a. A second metal layer 142 may be formed on the second barrier layer 140 to fill the second contact hole 138. The second barrier layer 140 may include, e.g., titanium, titanium nitride, tantalum, tantalum nitride, etc. The second metal layer 142 may include, e.g., cobalt, aluminum, copper, tungsten, nickel, platinum, gold, silver, etc.

Referring to FIGS. 1 to 4 again, upper layers, e.g., the second barrier layer 140, the second metal layer 142, and the insulation layer 134, may be planarized until the upper surface of the first contact plug 126 is planar with the planarized second barrier layer 140 and second metal layer 142, which define the second contact plug 144 in the second contact hole 138. That is the second contact plug 144 may include the second barrier pattern 140a and the second metal pattern 142a. A length in the first direction of the second contact plug 144 may be less than a length in the first direction of the first contact plug 126 adjacent to the second contact plug 144.

Particularly, the second barrier layer 140 and the second metal layer 142 may be planarized until the upper surface of the insulation layer 134 is exposed. The insulation layer 134, the second barrier layer 140, and the second metal layer 142 may be planarized until a top surface of the preliminary liner pattern 130a is exposed. The preliminary liner pattern 130a, the second barrier layer 140, and the second metal layer 142 may be exposed until the upper surface of the first contact plug 126 is exposed to form the second contact plug 144. Also, the preliminary liner pattern 130a on the sidewall of the second contact plug 144 may be separated to form the insulation spacer 130b. An upper portion of the preliminary liner pattern 130a may be partially etched to form the liner pattern 136b.

The upper surface of the second contact plug 144 may be coplanar with the upper surface of the first contact plug 126. The second contact plug 144 may be formed between the first contact plugs 126. The insulation spacer 130b may be formed between the second contact plug 144 and the first contact plug 126 adjacent to in the second direction the second contact plug 144. The insulation spacer 130b may be formed over the gate 128, and may extend along an extending direction of the gate 128.

The liner pattern 136b may be formed on the gate 128 to have a U-shape, so that the liner pattern 136b may not be separated from each other. An insulation pattern 134a may be formed to fill a recess defined by the liner pattern 136b.

Figure 23:
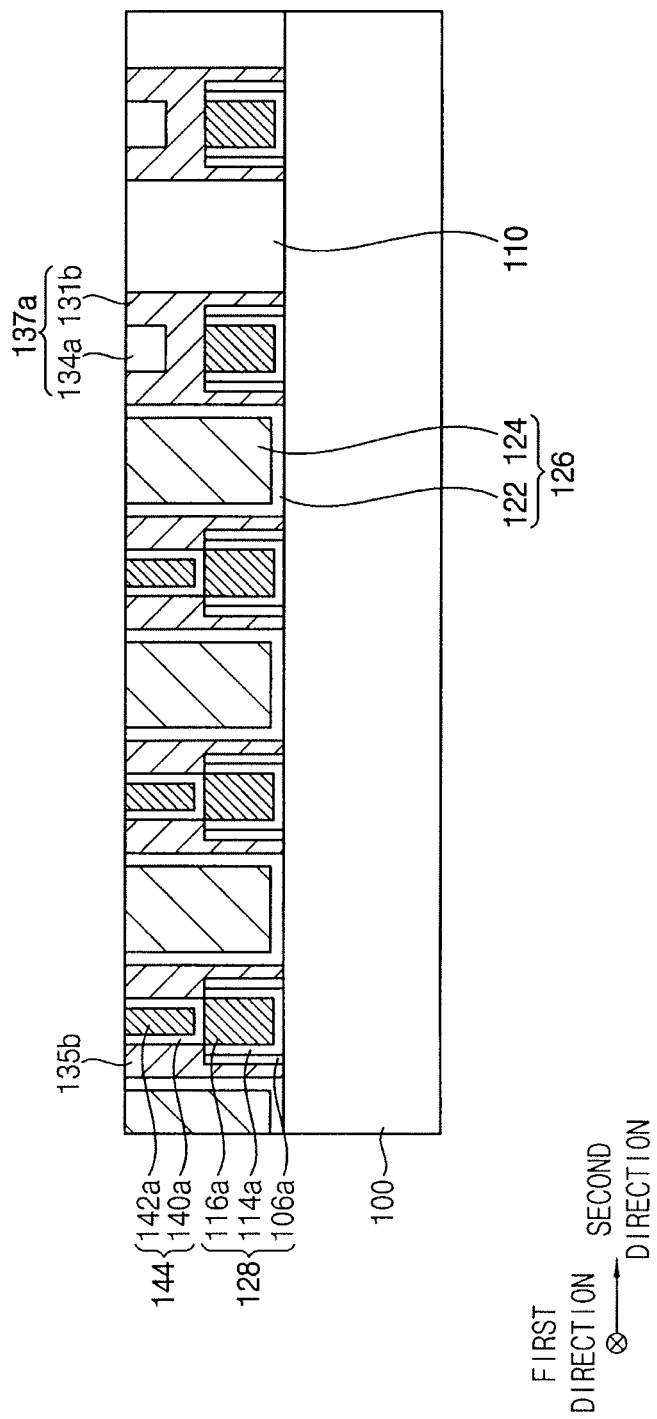
FIG. 23 illustrates a cross-sectional view of a semiconductor device in accordance with example embodiments.

FIG. 23 is a cross-sectional view illustrating a semiconductor device in accordance with example embodiments. The semiconductor device may be substantially the same as or similar to that of FIGS. 1 to 4, except for an insulation spacer and a liner pattern.

Referring to FIG. 23, an insulation spacer 135b may be formed between the first and second contact plugs 126 and 144, and between the gate 128 and the first contact plug 126. In example embodiments, the insulation spacer 135b may contact a sidewall of the first contact plug 126, a sidewall of the second contact plug 144, and a first spacer 106a. That is, the insulation spacer 135b may fill a portion between the gate 128 and the first contact plug 126. Thus, an air tunnel may not be formed below the insulation spacer 135b.

The liner pattern 131b may be formed on the gate 128 where the second contact plug 144 is not formed. In example embodiments, the liner pattern 131b may contact the sidewall of the first contact plug 126, an upper surface of the gate 128, the first spacer 106a and a sidewall of the first insulating interlayer 110. In some example embodiments, the liner pattern 131b may contact the sidewall of the first insulating interlayer 110, the first spacer 106a and the upper surface of the gate 128. An insulation pattern 134a may be formed on the liner pattern 131b to fill a recess of the liner pattern 131b.

In example embodiments, the liner pattern 131*b* may fill a portion between the gate 128 and the first contact plug 126, and a portion between the gate 128 and the first insulating interlayer 110. Thus, an air tunnel may not be formed below the liner pattern 131*b*. An upper surface of an insulation structure 137*a* including the liner pattern 131*b* and the insulation pattern 134*a* may be coplanar with the upper surface of the first contact plug 126.

Figure 24:
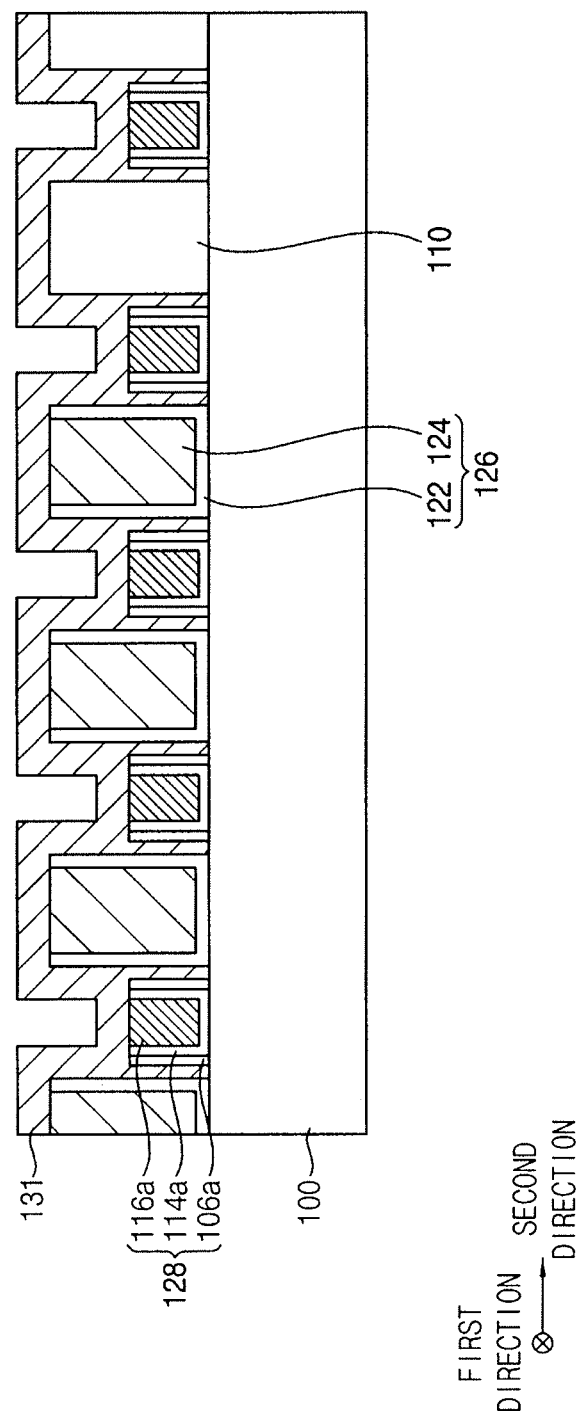
FIG. 24 illustrates a cross-sectional view of a stage in a method of manufacturing a semiconductor device in accordance with example embodiments.

FIG. 24 is a cross-sectional view illustrating a stage of a method of manufacturing a semiconductor device in accordance with example embodiments.

First, processes substantially the same as or similar to those illustrated with reference to FIGS. 5 to 15 may be performed to form the second opening.

Referring to FIG. 24, an insulation liner 131 may be formed on an upper surface and a sidewall of the gate 128, an upper surface and a sidewall of the first contact plug 126, and a surface of the first insulating interlayer 110. In example embodiments, the insulation liner 131 may fill the first gap. The insulation liner 131 may include a recess at a portion facing the upper surface of the gate 128. Then, processes substantially the same as or similar to those illustrated with reference to FIGS. 18 to 22 and FIGS. 1 to 4 may be performed. Thus, a semiconductor device shown in FIG. 23 may be manufactured.

Figure 25:
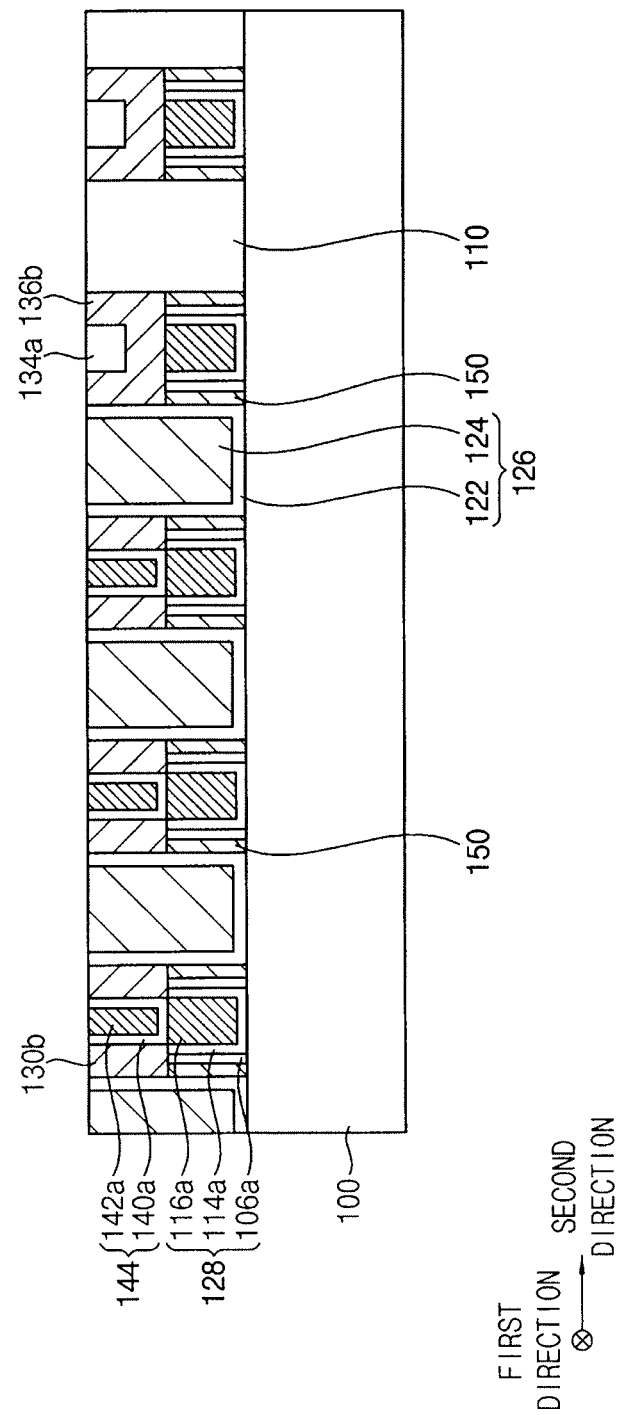
FIG. 25 illustrates a cross-sectional view of a semiconductor device in accordance with example embodiments.

FIG. 25 is a cross-sectional view illustrating a semiconductor device in accordance with example embodiments. The semiconductor device may be substantially the same as or similar to that of FIGS. 1 to 4, except for a lower insulation pattern.

Referring to FIG. 25, the lower insulation pattern 150 may fill portions below the insulation spacer 130*b* and the liner pattern 136*b*. In example embodiments, the insulation spacer 130*b* may be formed between the first and second contact plugs 126 and 144. Also, the lower insulation pattern 150 may be formed between the first contact plug 126 and the gate 128, below the insulation spacer 130*b*.

In example embodiments, the lower insulation pattern 150 may be formed between the first contact plug 126 and the gate 128, below the liner pattern 136*b*, and between the gate 128 and the first insulating interlayer 110. In example embodiments, the lower insulation pattern 150 may include a low dielectric material having a dielectric constant lower than a dielectric constant of silicon oxide.

Figure 26:
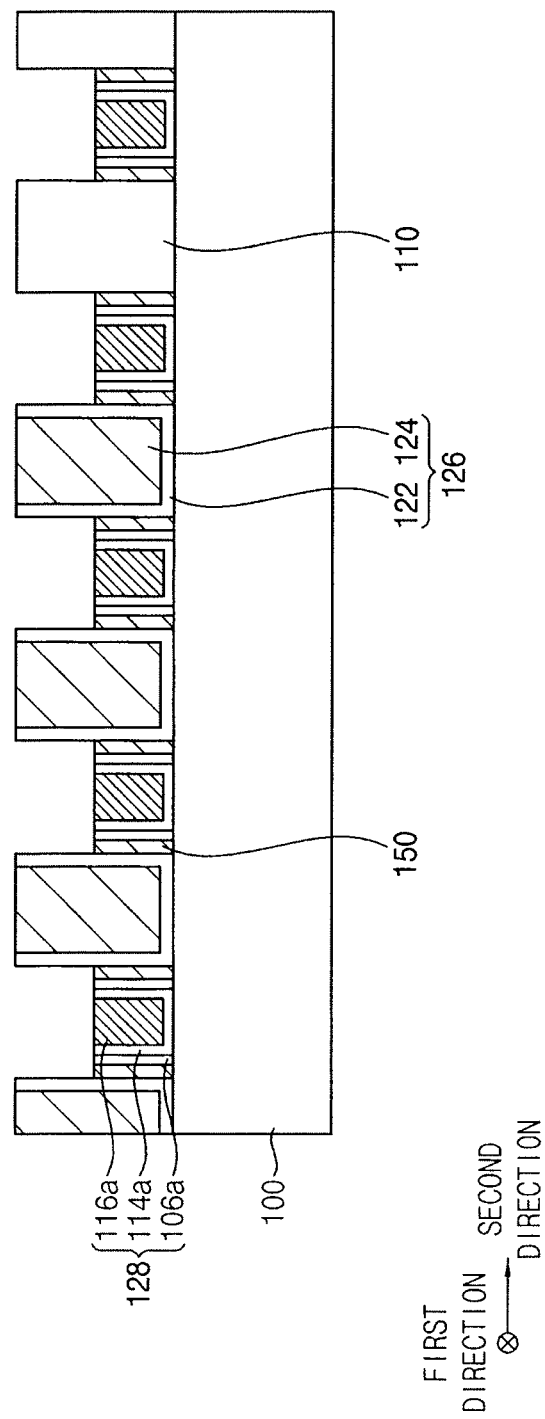
FIG. 26 illustrates a cross-sectional view of a stage in a method of manufacturing a semiconductor device in accordance with example embodiments.

FIG. 26 is a cross-sectional view illustrating a stage in a method of manufacturing a semiconductor device in accordance with example embodiments.

First, processes substantially the same as or similar to those illustrated with reference to FIGS. 5 to 15 may be performed to form the second opening.

Referring to FIG. 26, a lower insulation pattern 150 may be formed to partially or completely fill the first gap. The lower insulation layer may include a low dielectric material having a dielectric constant lower than a dielectric constant of silicon oxide. In example embodiments, an insulation layer may be formed to partially fill the first gap, and the insulation layer may be partially etched to form the lower insulation pattern. After forming the lower insulation pattern, an upper surface of the gate electrode may be exposed. Then, processes substantially the same as or similar to those illustrated with reference to FIGS. 18 to 22 and FIGS. 1 to 4 may be performed. Thus, a semiconductor device shown in FIG. 25 may be manufactured.

An arrangement of each element of the semiconductor device described above may be applied to a cell layout of an static random access memory (SRAM).

Figure 27:
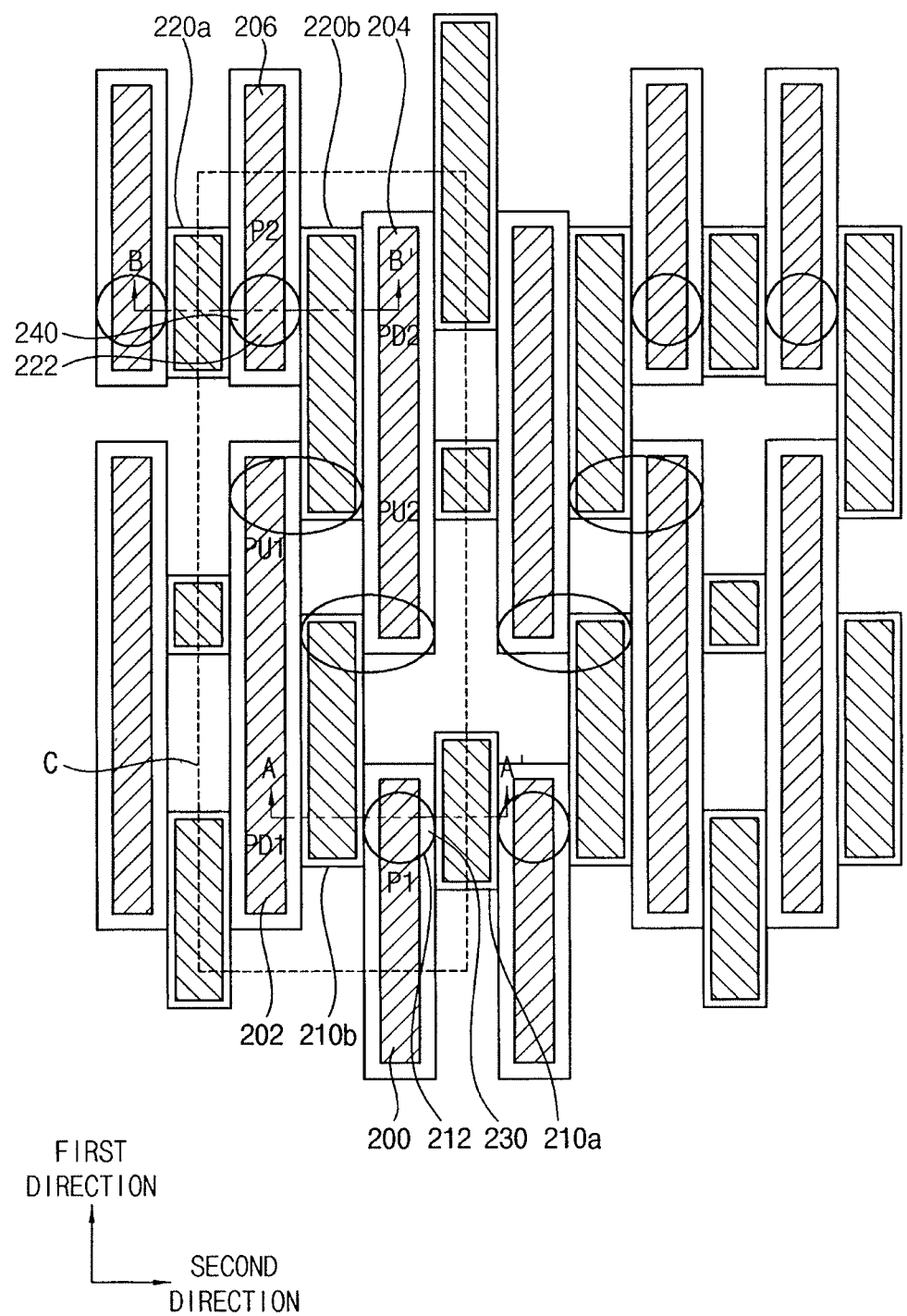
FIG. 27 illustrates a cell layout of a SRAM in accordance with example embodiments.
Figure 28:
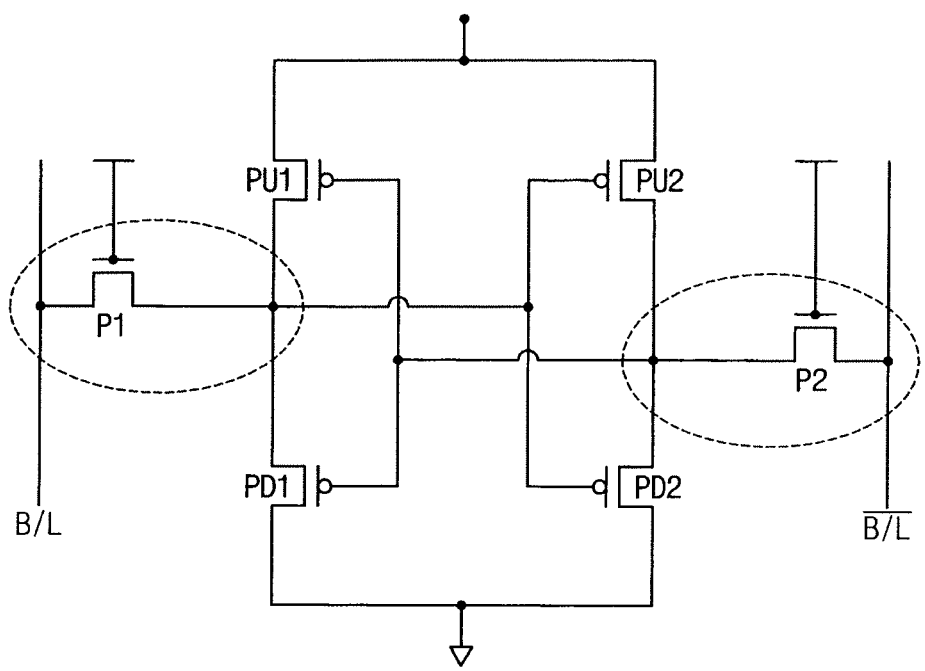
FIG. 28 illustrates a circuit diagram of a SRAM unit cell.

FIG. 27 is a cell layout of a SRAM in accordance with example embodiments. FIG. 28 is a circuit diagram of a SRAM unit cell.

In FIG. 27, for convenience of explanation, an active region or an active pin of the substrate is omitted, and only gates and contact plugs are shown. Unit cells included in the cell layout may be symmetric with each other, and may be repeatedly arranged. Hereinafter, arrangements of the gates and the contact plugs included in the unit cells will be mainly described.

Referring to FIGS. 27 and 28, the unit cell C may include two pass transistors P1 and P2, two pull-up transistors PU1 and PU2, and two pull-down transistors PD1 and PD2. The unit cell C may include first to fourth gate lines 200, 202, 204 and 206 for constituting the six transistors. The first to fourth gate lines 200, 202, 204, and 206 may extend in the first direction.

The first gate line 200 may serve as a gate of a first pass transistor P1. The second gate line 202 may serve as a common gate of the first pull-down transistor PD1 and the first pull-up transistor PU1. The third gate line 204 may serve as a common gate of the second pull-up transistor PU2 and the second pull-down transistor PD2. The fourth gate line 206 may serve as a gate of the second pass transistor P2.

In example embodiments, the first to fourth gate lines 200, 202, 204 and 206 may have a stacked structure substantially the same as a stacked structure of the gate illustrated with reference to FIGS. 1 to 4.

Although not shown, a substrate of an active region between the first to fourth gate lines 200, 202, 204, and 206 may serve as impurity regions of transistors.

In example embodiments, first contact plugs 210*a* and 210*b* may be electrically connected to the first and second impurity regions of the first pass transistor P1. For example, the first contact plug 210*a* connected to the first impurity region may contact the bit line B/L. The first contact plug 210*b* connected to the second impurity region may be electrically connected to the impurity regions of the first pull-down transistor PU1 and the first pull-down transistor PD1.

The length in the first direction of the first contact plug 210*b* connected to the second impurity region may be greater than the length in the first direction of the first contact plug 210*a* connected to the first impurity region. That is, the first contact plugs 210*a* and 210*b* serving as active contact plugs of the first pass transistor P1 may have different lengths in the first direction to each other. The first contact plugs 210*a* and 210*b* may include a mutually opposing portion and non-mutually opposing portions. An end portion of the first contact plug 210*b* connected to the second impurity region may be electrically connected to the third gate line 204.

At least portions of the first gate line 200 included in the first pass transistor P1 may be formed between the first contact plugs 210*a* and 210*b*.

In example embodiments, a second contact plug 212 may be electrically connected to the first gate line 200. The second contact plug 212 may contact an upper surface of the first gate line 200 between the first contact plugs 210*a* and 210*b*. Thus, in a cross-sectional view taken along line in the second direction, the first contact plug 210*a*, the second contact plug 212, and the first contact plug 210*b* may be sequentially arranged.

An insulation spacer 230 may be formed between the first and second contact plugs 210*a*, 210*b*, and 212. Also, a liner pattern and an insulation pattern may be formed on the first gate line 200 where the second contact plug 212 is not formed. In example embodiments, the insulation spacer, the liner pattern, and the insulation pattern may have structures the same as those illustrated with reference to FIGS. 1 to 4, respectively. In some example embodiments, the insulation spacer, the liner pattern, and the insulation pattern may have structures the same as those illustrated with reference to FIG. 12, respectively. In some example embodiments, the insulation spacer, the liner pattern, and the insulation pattern may have structures the same as those illustrated with reference to FIG. 25, respectively.

Similarly to the first pass transistor P1 and the first contact plugs 210*a* and 210*b*, third contact plugs 220*a* and 220*b* may be electrically connected to the third and fourth impurity regions of the second pass transistor P2. The third contact plug 220*a* connected to the third impurity region may contact the bit line bar (B/L/). The third contact plug 220*b* connected to the fourth impurity region may be connected to impurity regions of the second pull-down transistor PU2 and the second pull-down transistor PD2. Thus, a length in the first direction of the third contact plug 220*b* connected to the fourth impurity region may be greater than a length in the first direction of the third contact plug 220*a* connected to the third impurity region. An end portion of the third contact plug 220*b* connected to the fourth impurity region may be electrically connected to the second gate line 202.

At least portions of the fourth gate line 206 of the second pass transistor P2 may be formed between the third contact plugs 220*a* and 220*b*.

In example embodiments, a fourth contact plug 222 may be electrically connected to the fourth gate line 202 of the second pass transistor P2. The fourth contact plug 222 may contact an upper surface of the fourth gate line 206 between the third contact plugs 220*a* and 220*b*. Thus, in a cross-sectional view taken along line in the second direction, the third contact plug 220*a*, the fourth contact plug 222, and the third contact plug 220*b* may be sequentially arranged.

An insulation spacer 240 may be formed between the third and fourth contact plugs 220*a*, 220*b*, and 222. Also, a liner pattern and an insulation pattern may be formed on the fourth gate line 206 where the fourth contact plug 222 is not formed. In example embodiments, the insulation spacer, the liner pattern, and the insulation pattern may have structures the same as those illustrated with reference to FIGS. 1 to 4, respectively. In some example embodiments, the insulation spacer, the liner pattern, and the insulation pattern may have structures the same as those illustrated with reference to FIG. 23, respectively. In example embodiments, the insulation spacer, the liner pattern, and the insulation pattern may have structures the same as those illustrated with reference to FIG. 25, respectively.

In example embodiments, the cross section of the first gate line 200, the first contact plugs 210*a* and 210*b* and the second contact plug 212 included in the first pass transistor P1, that is the cross section of an A-A' portion in FIG. 27, may be substantially the same as that shown in FIG. 2. Also, the cross section of the fourth gate line 206, the third contact plugs 220*a* and 220*b* and the fourth contact plug 222 included in the second pass transistor P2, that is the cross section of a B-B' portion in FIG. 27, may be substantially the same as that shown in FIG. 2.

In some example embodiments, the cross sections of the A-A' portion and the B-B' portion in FIG. 27 may be substantially the same as that shown in FIG. 23. Alternatively, the cross sections of the A-A' portion and the B-B' portion in FIG. 27 may be substantially the same as that shown in FIG. 25.

As described above, contact plugs contacting the gates of first and second pass transistors in the unit cell of the SRAM device (i.e., gate contact plugs) are formed between contact plugs contacting active regions (i.e., active contact plugs). Thus, a horizontal area for forming the gate contact plugs may not be needed.

By way of summation and review, in the semiconductor device in accordance with example embodiments, the second contact plug may contact an insulation pattern and an insulation liner in the first direction, and may contact the insulation liner in the second direction. That is, the second contact plug may be self-aligned by the insulation liner, so that the second contact plug may contact the gate electrode. Thus, failures, e.g., short between the first and second contact plugs, leakage currents of the transistor, etc., may decrease. The second contact plug may contact an upper surface of the gate electrode between the first contact plugs. Thus, a horizontal area of the substrate for forming the second contact plug may decrease.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A semiconductor device, comprising:
   a plurality of gates extending in a first direction on a substrate, each gate of the plurality of gates including a gate insulation layer, a gate electrode, and a first spacer;
   a plurality of first contact plugs contacting the substrate between adjacent ones of the plurality of gates, the plurality of first contact plugs being spaced apart from sidewalls of corresponding ones of the plurality of gates;
   a second contact plug contacting an upper surface of a corresponding gate electrode, the second contact plug being between first contact plugs of the plurality of first contact plugs; and
   an insulation spacer in a gap between the second contact plug and an adjacent first contact plug of the plurality of first contact plugs, the insulation spacer contacting sidewalls of the second contact plug and the adjacent first contact plug of the plurality of first contact plugs,
   wherein the plurality of first contact plugs and the second contact plug are arranged along one imaginary straight line, in a top view, and
   wherein upper surfaces of the second contact plug and the adjacent first contact plug are substantially coplanar with each other.

2. The semiconductor device as claimed in claim 1, wherein a length in the first direction of the first contact plug is greater than a length in the first direction of the second contact plug, the first direction extending in parallel to an upper surface of the substrate.

3. The semiconductor device as claimed in claim 1, further comprising an insulation structure covering the upper surface of each gate of the plurality of gates, the insulation structure including a liner pattern and an insulation pattern.

4. The semiconductor device as claimed in claim 3, wherein an upper surface of the insulation structure is substantially coplanar with the upper surfaces of the second contact plug and the adjacent first contact plug.

5. The semiconductor device as claimed in claim 3, wherein the liner pattern has a U-shape having a recess, and the insulation pattern fills the recess.

6. The semiconductor device as claimed in claim 3, wherein the liner pattern includes a substantially same material as that of the insulation spacer, the liner pattern and the insulation spacer being connected to each other.

7. The semiconductor device as claimed in claim 3, wherein the liner pattern and the insulation spacer include silicon nitride.

8. The semiconductor device as claimed in claim 1, further comprising a first insulating interlayer among the plurality of gates, the first insulating interlayer being on the sidewalls of corresponding ones of the plurality of first contact plugs, and the first insulating interlayer being spaced apart from sidewalls of the plurality of gates.

9. The semiconductor device as claimed in claim 1, wherein a width in a second direction perpendicular to the first direction of the insulation spacer is greater than a width in the second direction of a gap between the adjacent first contact plug and an adjacent gate of the plurality of gates.

10. The semiconductor device as claimed in claim 1, further comprising an air tunnel under the insulation spacer and extending in a first direction, the air tunnel being between the adjacent first contact plug and an adjacent gate of the plurality of gates, and the air tunnel being filled with air.

11. The semiconductor device as claimed in claim 1, wherein the insulation spacer extends to a surface of the substrate, the insulation spacer filling a gap between the adjacent first contact plug and an adjacent gate of the plurality of gates.

12. A semiconductor device, comprising:
a plurality of gates extending in a first direction on an upper surface of a substrate, the first direction extending in parallel to the upper surface of the substrate, and each gate of the plurality of gates including a gate insulation layer, a gate electrode, and a first spacer;
a plurality of first contact plugs contacting the substrate between adjacent ones of the plurality of gates, the plurality of first contact plugs being spaced apart from sidewalls of corresponding ones of the plurality of gates, and upper surfaces of the plurality of first contact plugs being higher than an upper surface of each of the plurality of gates;
an insulation structure covering the upper surface of each of the plurality of gates, the insulation structure including a liner pattern and an insulation pattern;
a second contact plug on a corresponding gate of the plurality of gates, the second contact plug contacting an upper surface of the gate electrode of the corresponding gate between first contact plugs of the plurality of first contact plugs; and
an insulation spacer between the second contact plug and an adjacent first contact plug of the plurality of first contact plugs, the insulation spacer contacting sidewalls of the second contact plug and the adjacent first contact plug, and a length in the first direction of the adjacent first contact plug is greater than a length in the first direction of the second contact plug in a top view.

13. The semiconductor device as claimed in claim 12, wherein the liner pattern has a U-shape having a recess, and the insulation pattern fills the recess.

14. The semiconductor device as claimed in claim 13, wherein the liner pattern has a substantially same material as that of the insulation spacer, and the liner pattern and the insulation spacer are connected to each other.

15. The semiconductor device as claimed in claim 12, further comprising a first insulating interlayer among the plurality of gates, the first insulating interlayer being spaced apart from the sidewalls of the plurality of gates.

16. The semiconductor device as claimed in claim 12, wherein upper surfaces of the plurality of first contact plugs, the second contact plug, and the insulation structure are substantially coplanar with each other.

17. The semiconductor device as claimed in claim 12, wherein a width in a second direction perpendicular to the first direction of the insulation structure is greater than a width in the second direction of each gate of the plurality of gates.

18. The semiconductor device as claimed in claim 12, further comprising an air tunnel under the insulation spacer and the insulation structure, the air tunnel being filled with air and extending in the first direction, and the air tunnel being between each gate of the plurality of gates and an adjacent first contact plug of the plurality of contact plugs.

19. A semiconductor device, comprising:
a plurality of gates extending in a first direction on a substrate, each gate of the plurality of gates including a gate insulation layer, a gate electrode, and a first spacer;
a plurality of first contact plugs contacting the substrate between adjacent ones of the plurality of gates, the plurality of first contact plugs being spaced apart from sidewalls of corresponding ones of the plurality of gates;
an insulation structure covering upper surfaces of the plurality of gates, the insulation structure including a liner pattern and an insulation pattern; and
a second contact plug through the insulation pattern and liner pattern under the insulation pattern, the second contact plug contacting an upper surface of a corresponding gate electrode between adjacent first contact plugs among the plurality of first contact plugs,
wherein the liner pattern has a U-shape having a recess, the insulation pattern filling the recess, and the liner pattern separating between the insulation pattern and the upper surfaces of the plurality of gates, and
wherein a width in a second direction perpendicular to the first direction of the insulation structure is greater than a width in the second direction of each of the plurality of gates.

20. The semiconductor device as claimed in claim 19, wherein sidewalls in the first direction of the second contact plug contact the insulation pattern, and sidewalls in the second direction perpendicular to the first direction of the second contact plug contact the liner pattern.

* * * * *